United States Patent [19]
Hoshino et al.

[11] Patent Number: 5,544,201
[45] Date of Patent: Aug. 6, 1996

[54] SIGNAL SUPPRESSING APPARATUS

[75] Inventors: Tsutomu Hoshino; Atsushi Yamaguchi; Tadashi Ohashi; Juro Ohga; Hiroyuki Furuya, all of Kawasaki, Japan

[73] Assignee: Fujitsu Limited, Kanagawa, Japan

[21] Appl. No.: 272,330

[22] Filed: Jul. 8, 1994

[30] Foreign Application Priority Data

Sep. 17, 1993 [JP] Japan .................................. 5-254837

[51] Int. Cl.$^6$ .................................................. H04B 1/10
[52] U.S. Cl. ............... 345/350; 364/424.16; 364/424.19
[58] Field of Search ................................... 375/350, 346; 364/724.12, 724.14, 724.16, 724.19; 455/307, 296

[56] References Cited

U.S. PATENT DOCUMENTS

| | | | |
|---|---|---|---|
| 3,723,911 | 3/1973 | Forney, Jr. | 333/18 |
| 3,758,881 | 9/1973 | Rummler | 333/16 |
| 4,196,405 | 4/1980 | Le Dily et al. | 333/16 |
| 4,377,793 | 3/1983 | Horna | 333/165 |
| 4,760,540 | 7/1988 | Yuen | 364/724.19 |
| 4,868,775 | 9/1989 | Kobayashi et al. | 364/724.19 |
| 4,951,269 | 8/1990 | Amano et al. | 367/135 |
| 5,027,369 | 6/1991 | Kuenast | 375/14 |
| 5,315,621 | 5/1994 | Lucioni et al. | 345/350 |
| 5,383,145 | 1/1995 | Sakiyama et al. | 364/724.16 |
| 5,388,062 | 2/1995 | Knutson | 364/724.16 |

FOREIGN PATENT DOCUMENTS

| | | |
|---|---|---|
| 0347394 | 12/1989 | European Pat. Off. . |
| 0399382 | 11/1990 | European Pat. Off. . |
| 0543568 | 5/1993 | European Pat. Off. . |
| 2749099 | 5/1978 | Germany . |

OTHER PUBLICATIONS

John G. Proakis, et al., "Introduction to Digital Signal Processing", New York, MacMillan Publishing Co., 1988, pp. 429–457.

Kosaka and Yamada, Technical Report EA 88–26, Electronics Information and Communication Institute, Japan, 1988, pp. 14–16.

B. Widrow et al., "Adaptive Signal Processing", Prentice-Hall, Englewood Cliffs, NJ, 1985, pp. 288–295.

Primary Examiner—Stephen Chin
Assistant Examiner—T. Ghebretinsae

[57] ABSTRACT

A signal suppressing apparatus for suppressing undesired signal components, in which a first filter electrically simulating a propagation system A of a physical phenomena such as a sound, vibration, electricity, etc. is mounted; a signal having a correlation to the signal to be input to the propagation system A is input to this first filter; and the output of the first filter exerts an influence upon the signal passing the propagation system A to make the passed signal approximate the intended value, wherein the first filter is split into a plurality of filters, each of which is composed by a discrete DSP, outputs are individually calculated in the split individual filters, and the individual calculation results are tabulated, whereby a value the same as the value obtained where the calculation is made without splitting of the first filter is obtained. This enables high speed signal processing even if a high speed DSP is not used.

43 Claims, 29 Drawing Sheets

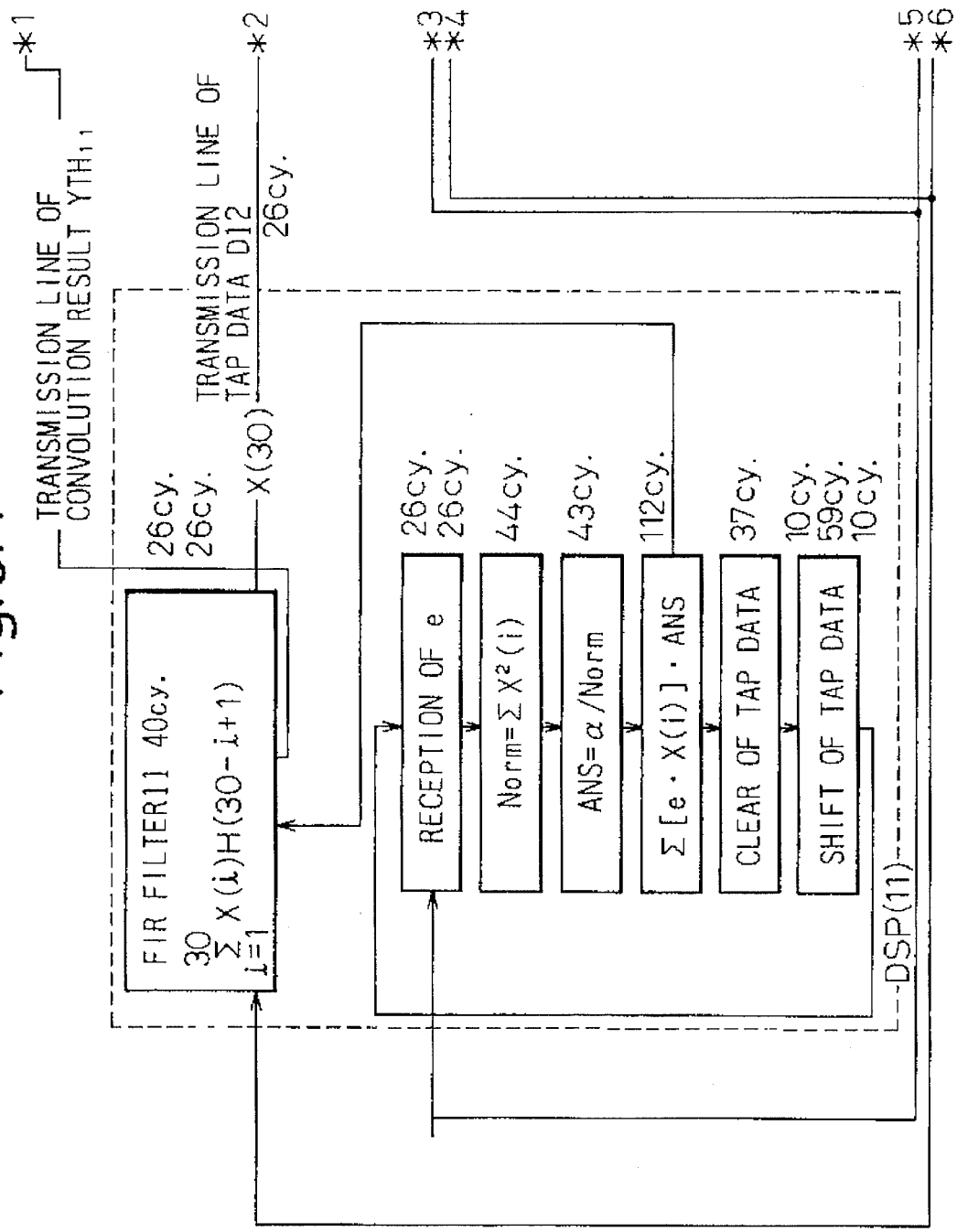

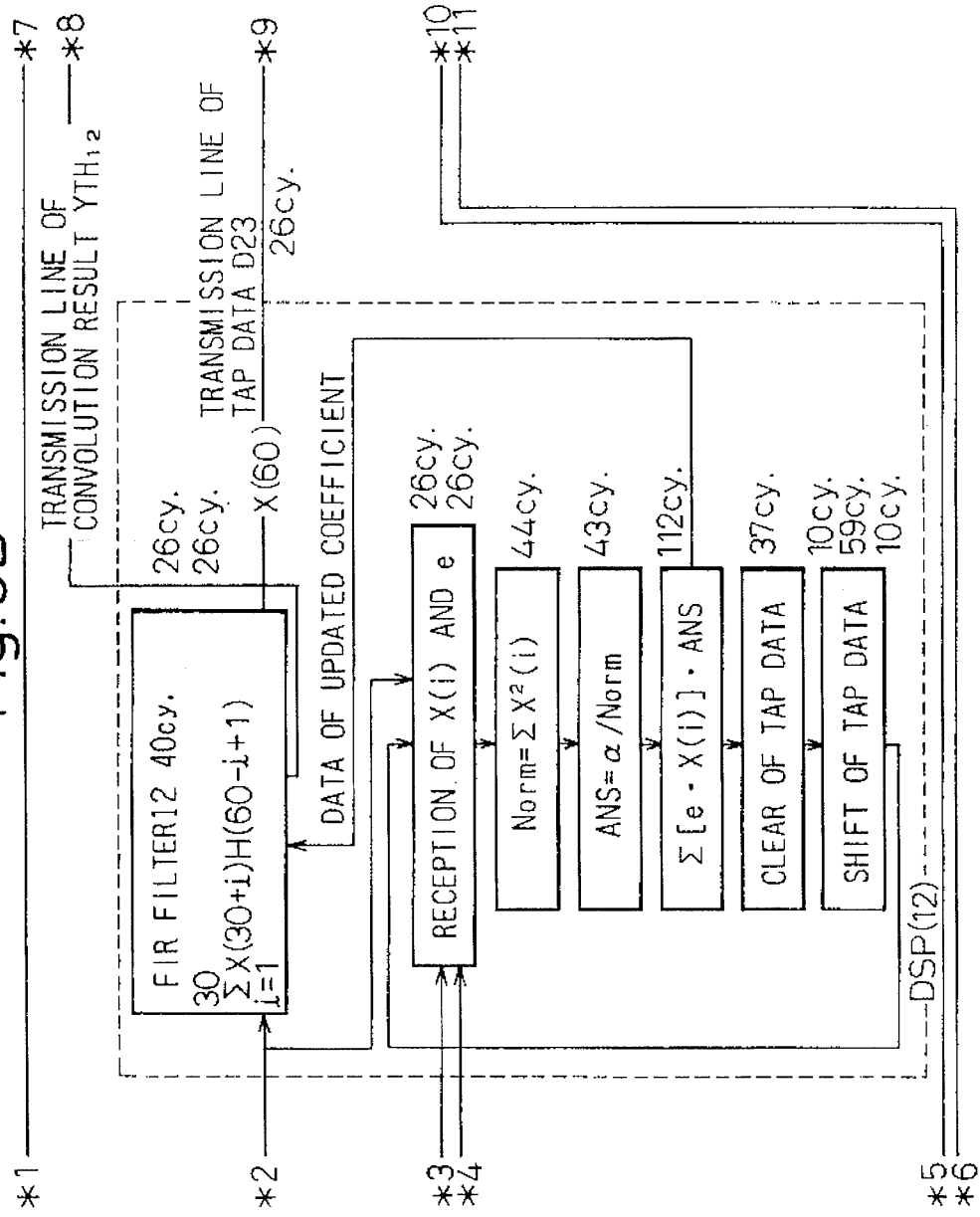

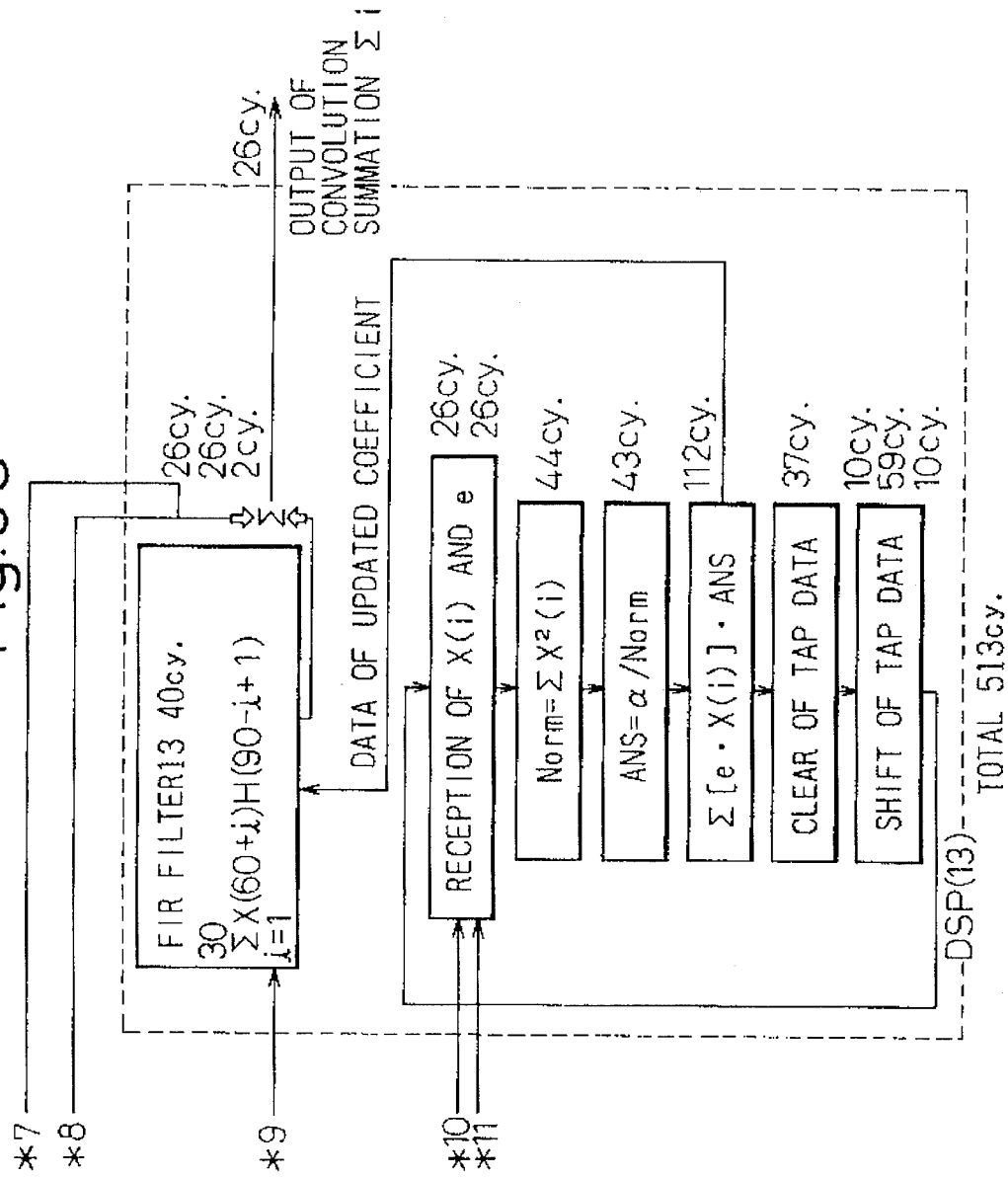

END
PROCESSING FLOW IN DSP AND NUMBER
OF TOTAL CYCLES (=898cy.)

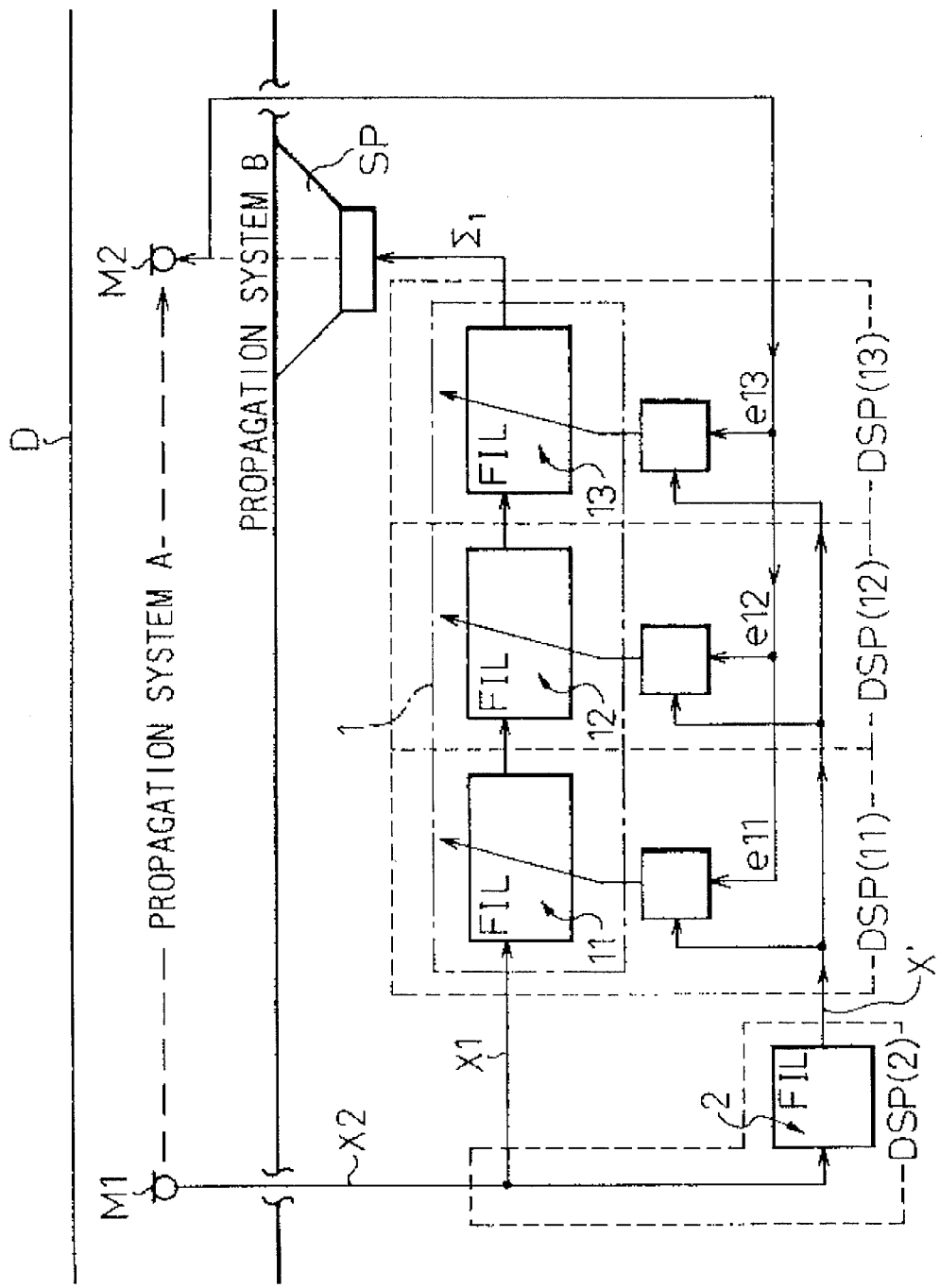

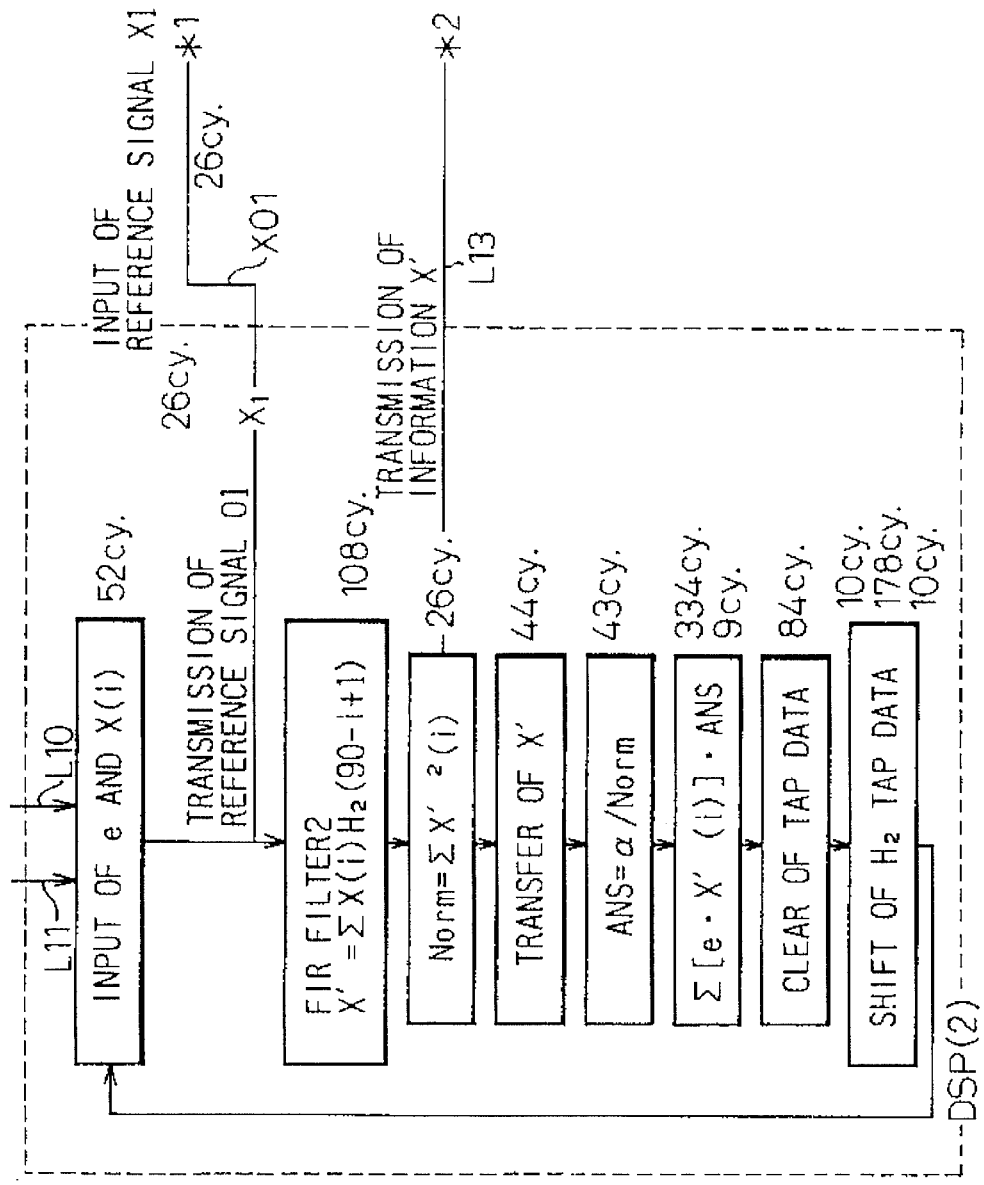

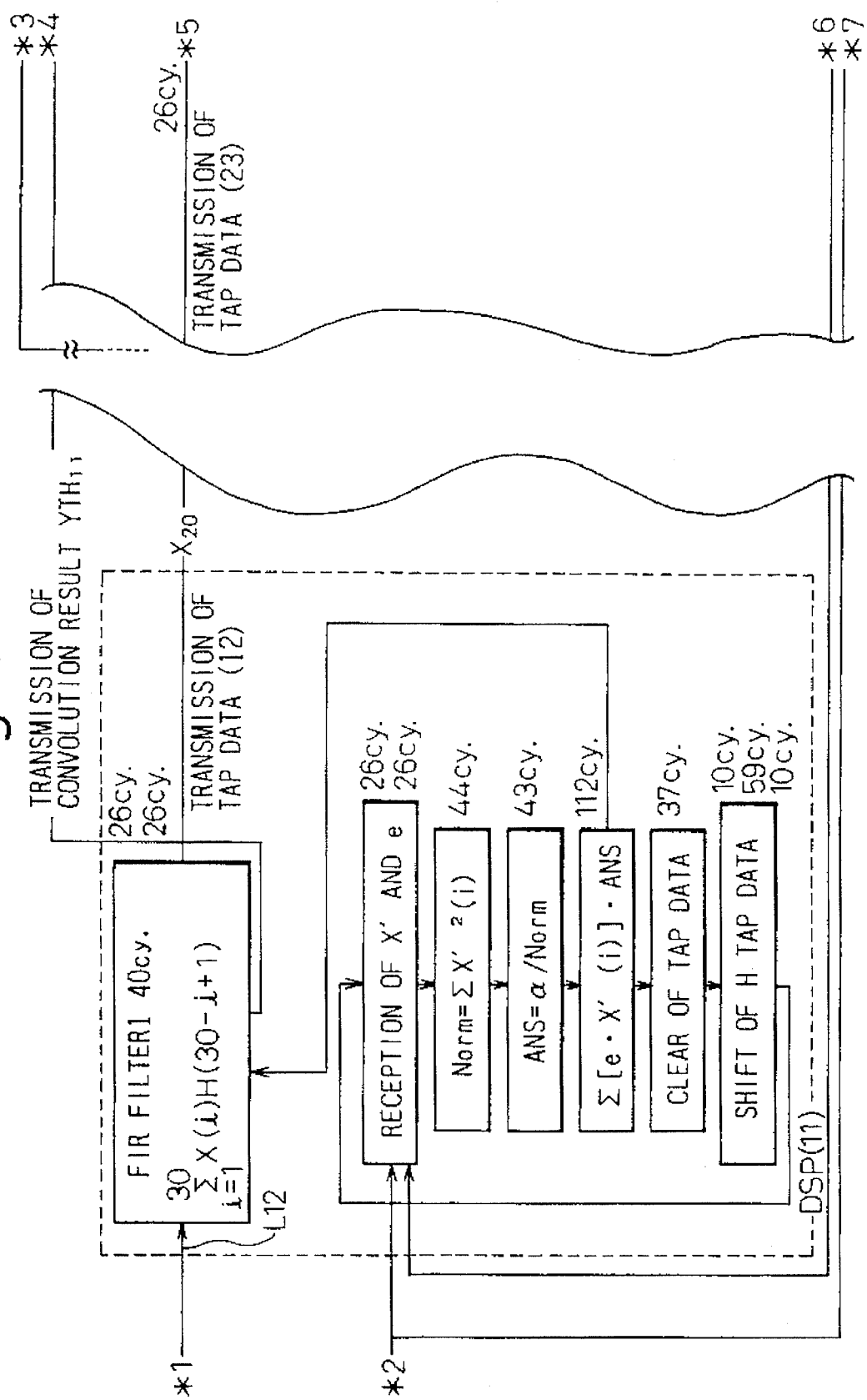

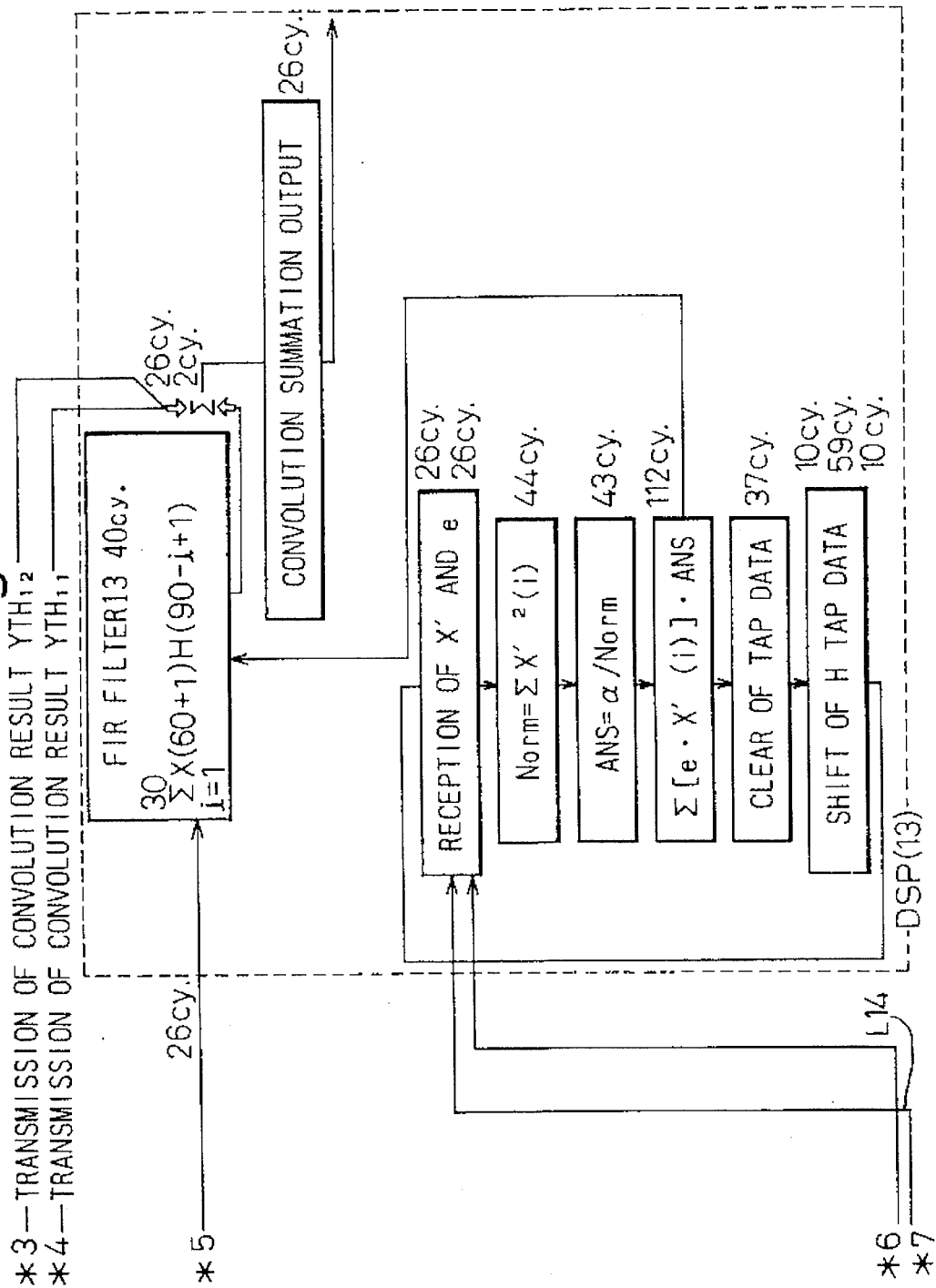

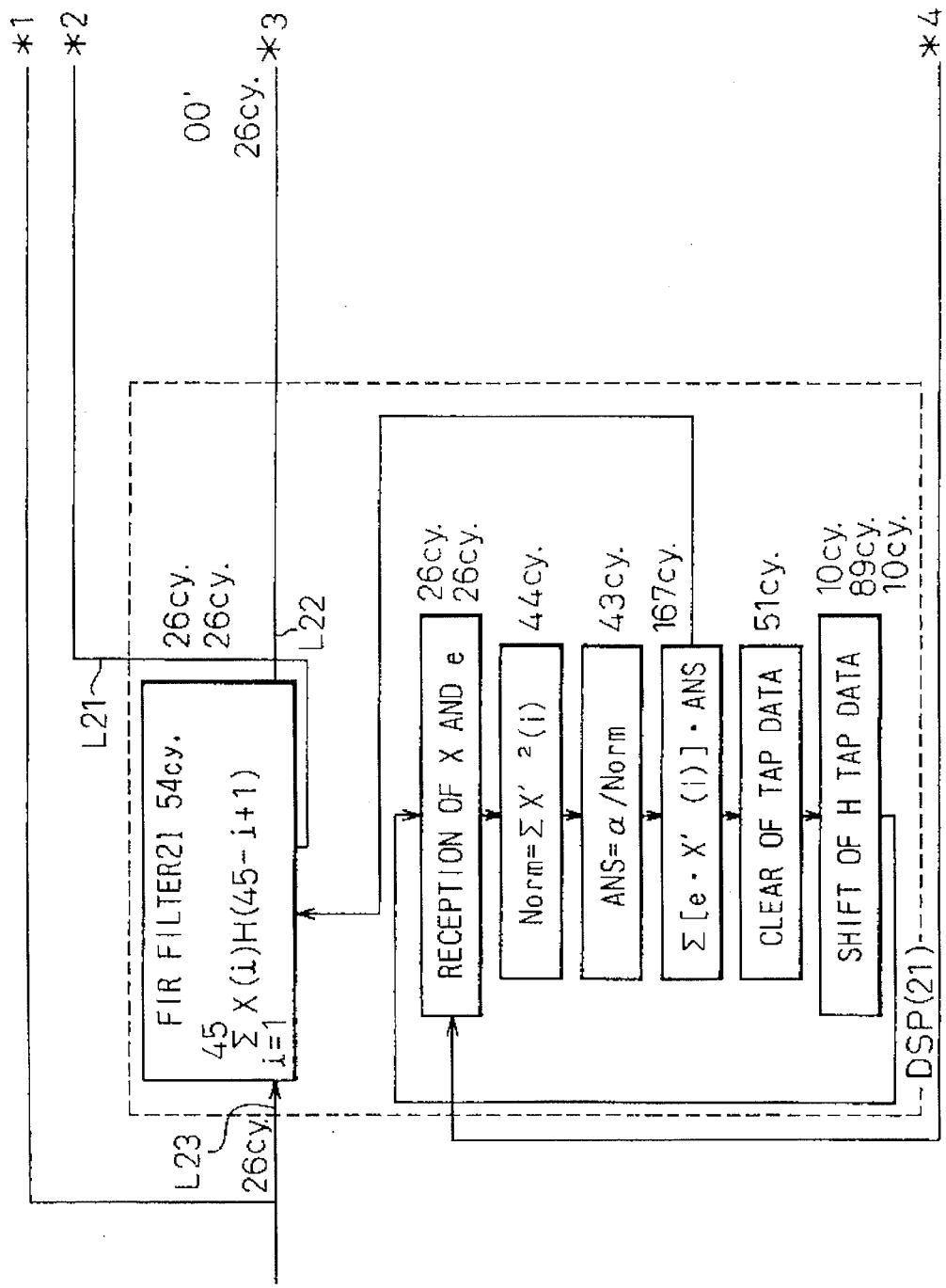

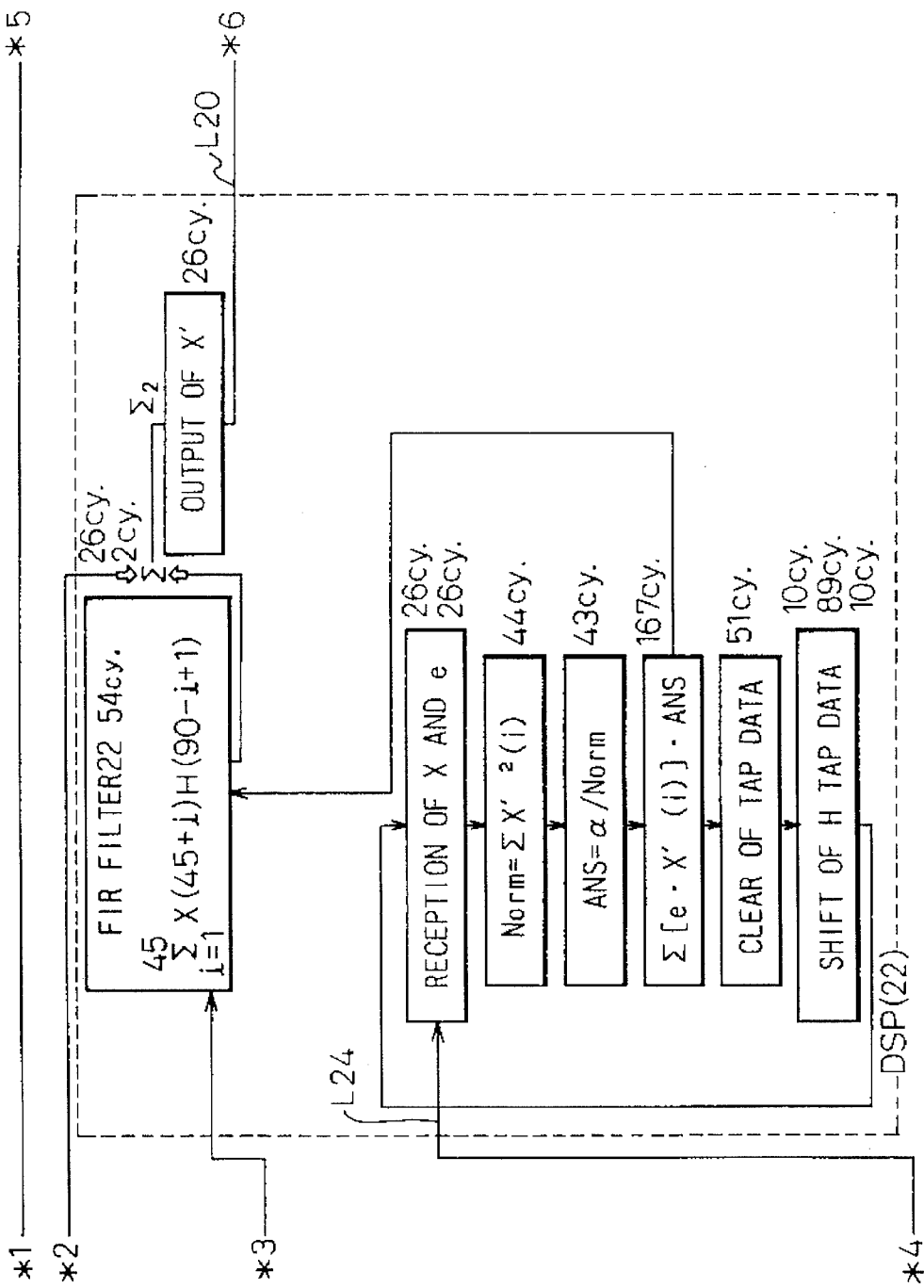

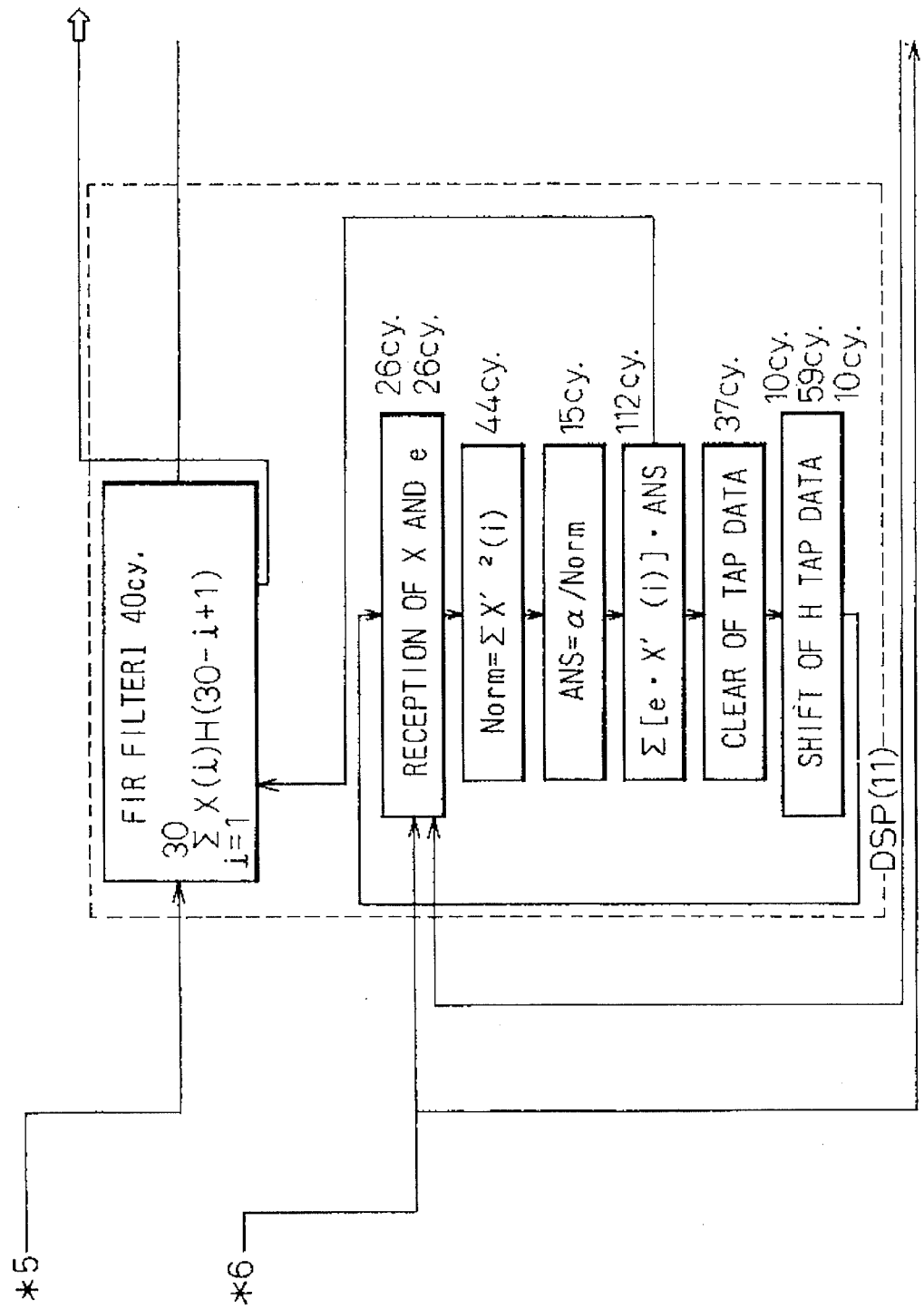

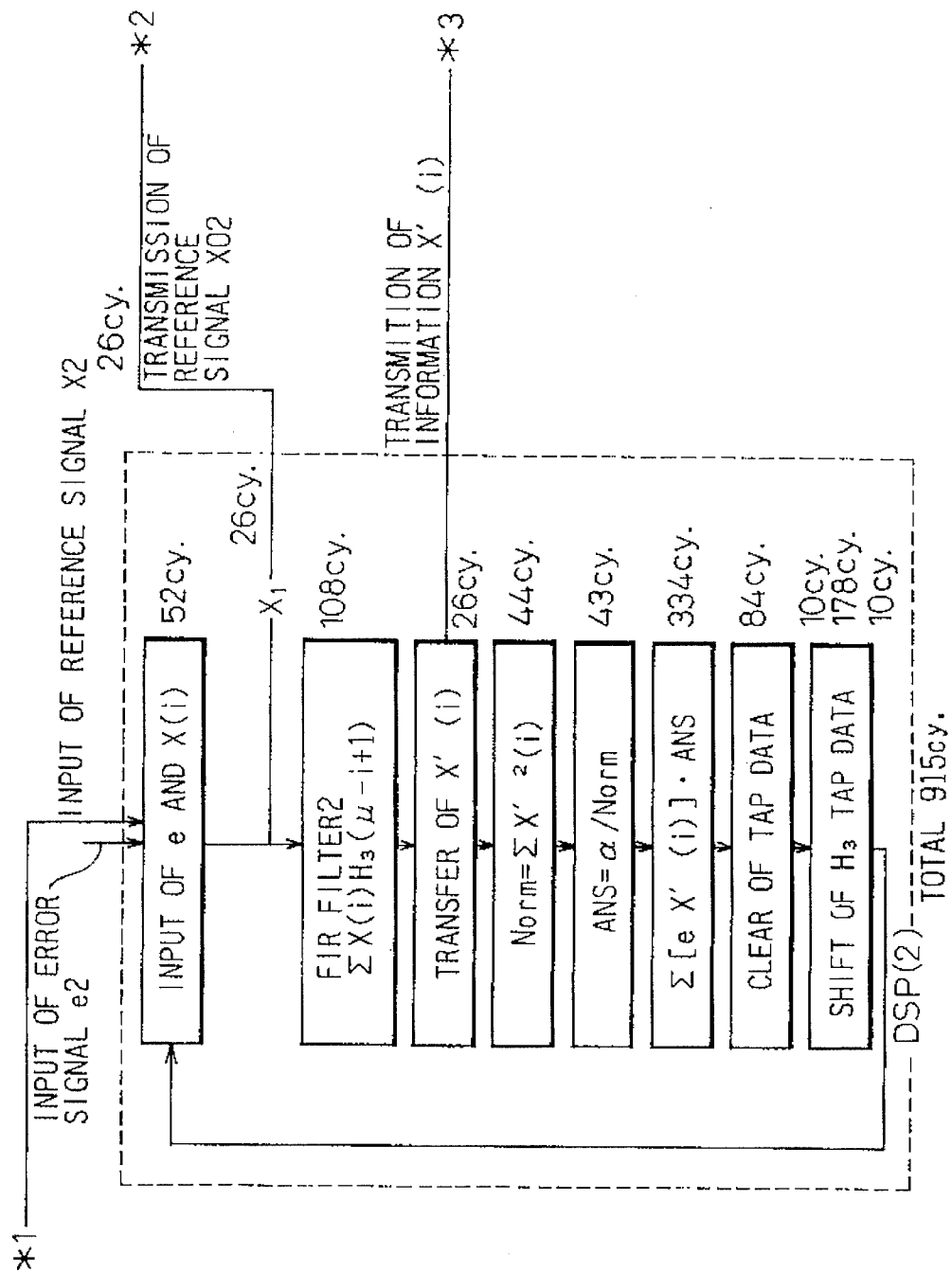

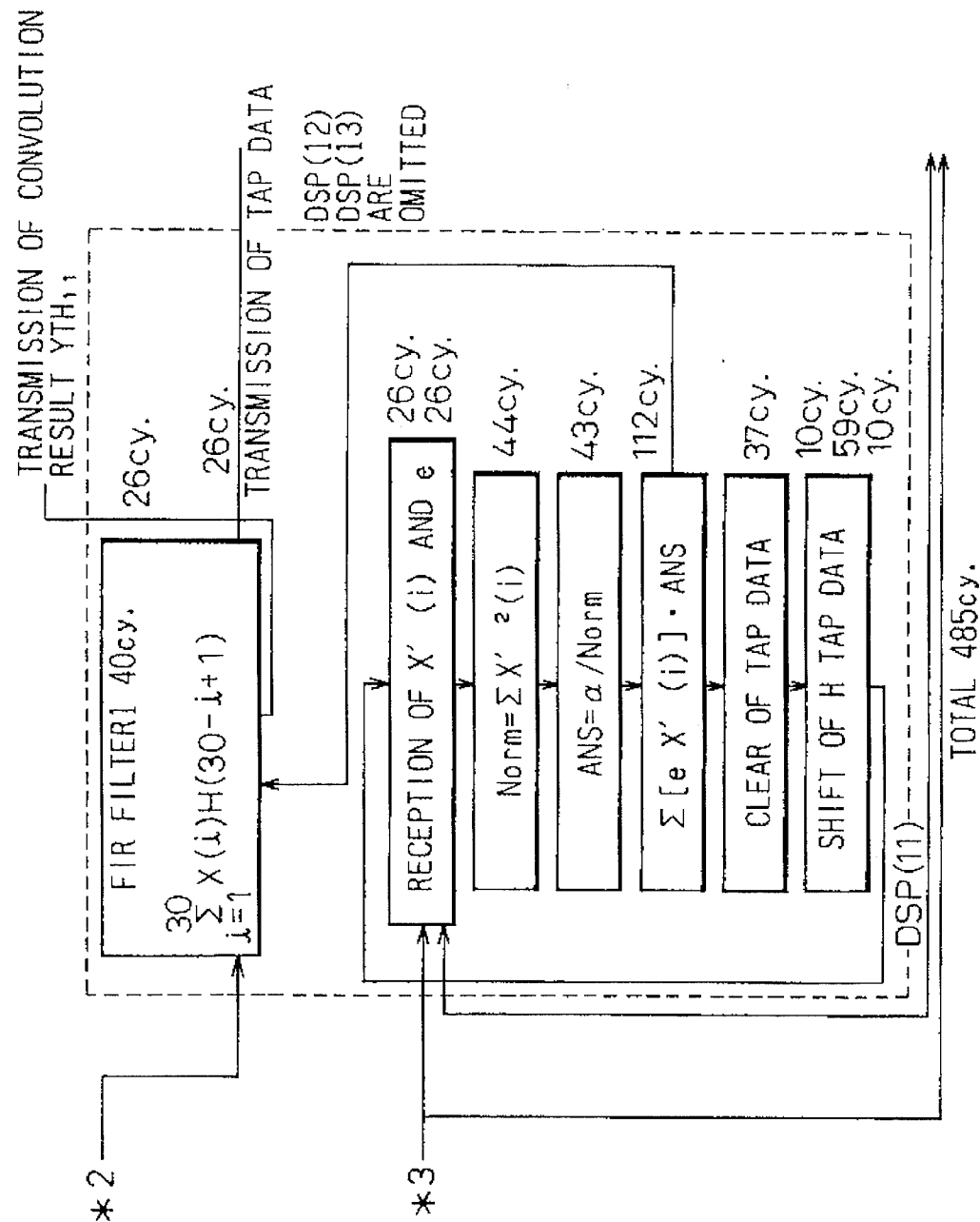

SIGNAL SUPPRESSING APPARATUS

BACKGROUND OF THE INVENTION

1. Field of the Invention

The present invention relates to a signal suppressing apparatus suppressing undesired signal components.

Devices for controlling the suppression of undesired signals such as echo cancelers, noise cancelers, ghost cancelers, active noise control systems, active vibration control systems, active suspensions, etc. have now spread in general use. In these systems, when creating a signal processing system, there is a problem in that there is a time lag in the signal processing at that processing system and this obstructs realization of the phase-characteristics of the transfer function needed. For this reason, it is necessary to increase the speed of operation of the processing system and shorten the time lag produced in the signal processing as much as possible.

2. Description of the Related Art

The processing system of the signal suppressing system mentioned above makes frequent use of multiplication and accumulation operations and therefore usually is constituted by a digital signal processor (DSP). In recent years, high speed operation has become possible in DSP's, but tasks are processed in a single task format (processing for sequentially executing routines wherein after a certain single routine in the DSP software is ended, the next routine is started). Unlike with a general purpose CPU, it is not possible to simultaneously execute a plurality of processings in a multi-task format.

As mentioned above, current DSP's all perform processing by the single task format, and therefore the processing speed depends on the capability of the DSP. For this reason, it is necessary to provide a high speed DSP for performing high speed processing. As a result, the cost for realization of the processing system naturally rises. In addition, this means that there are time delay elements in the processing system, which become an obstacle in the realization of the phase characteristics of the intended transfer function and become an obstacle to optimal control.

For example, consider a case where the signal suppressing apparatus is applied to an active noise control system aimed at random noise having non-periodic components. In this active noise control system, when the noise from a noise source is emitted to the outside by propagation through a duct etc., a sound cancelation signal having the same magnitude and inverse phase to the noise is prepared by a digital filter (cancelation filter) comprising a DSP, and this is superposed on the noise by a speaker etc. near the outlet of the noise to cancel the noise, but if there is a large time delay in the signal processing for creating the sound cancelation signal by this cancelation filter, where the noise propagation path is short, the cancelation sound is not created at the same timing as the noise to be canceled, and therefore the noise cannot be canceled. As a result, there arises an inconvenience in that this system can only be applied to systems having a long noise propagation path and a large size.

SUMMARY OF THE INVENTION

The present invention was made in consideration of such a problem and has as its object the provision of a signal suppressing apparatus which can perform high speed signal processing even if a high-speed DSP is not used.

To achieve the above-mentioned object, according to the present invention, there is provided a signal suppressing apparatus wherein a first filter which electrically simulates a propagation system A of a physical phenomena such as sound, vibration, electricity, etc. is provided, a signal correlated to a signal input to a propagation system A is input to this first filter, and the output of this first filter exerts an influence upon the signal which passed through the propagation system A to make the passed signal approximate an intended value, wherein the first filter is split into a plurality of filters (11, 12, 13), the individual filters are composed by discrete DSP's, outputs are individually calculated by the split individual filters, and the individual calculation results thereof are tabulated, whereby a value the same as the value obtained where a calculation is made without splitting the above-described first filter is obtained.

BRIEF DESCRIPTION OF THE DRAWINGS

The above object and features of the present invention will be more apparent from the following description of the preferred embodiments with reference to the accompanying drawings, wherein:

FIGS. 3A, 3B, and 3C are views showing the detailed processing procedure in a principal part of the first embodiment;

FIG. 5 is a view showing the schematic structure according to a second embodiment of the signal suppressing apparatus of the present invention;

FIGS. 6A, 6B and 6C are views showing the detailed processing procedure in major portions of the second embodiment;

FIGS. 8A, 8B and 8C are views showing the detailed processing procedure in major portions of the third embodiment;

FIGS. 10A, 10B and 10C are views showing the detailed processing procedure in major portions of the fourth embodiment;

DESCRIPTION OF THE PREFERRED EMBODIMENT

Figure 1:
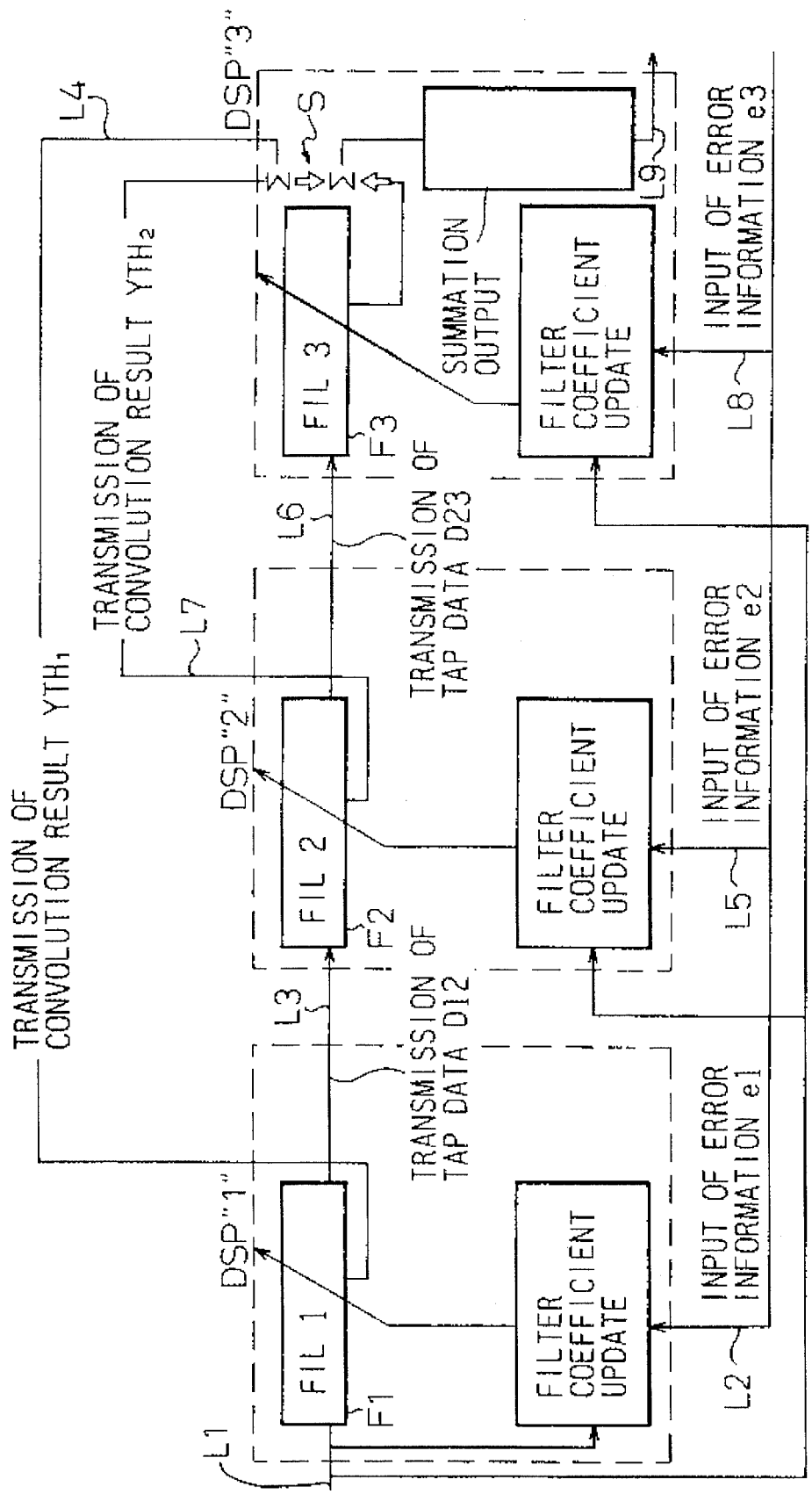
FIG. 1 is a view used for an explanation of the principle of the present invention.

The embodiments of the present invention will be described next with reference to the related figures.

So as to solve the above-mentioned subject, in the present invention, there is provided as a first aspect a signal suppressing apparatus wherein a first filter (1) which electrically simulates a propagation system (A) of a physical phenomena such as a sound, vibration, electricity, etc. is provided, a signal correlated to a signal input to a propagation system (A) is input to this first filter; the output of this first filter exerts an influence upon the signal which passed through the propagation system (A) to make the passed signal approximate an intended value, wherein the first filter is split into a plurality of filters (11, 12, 13); the individual filters are composed by discrete DSP's, outputs are individually calculated in the split individual filters; and individual calculation results thereof are tabulated, whereby a value the same as the value obtained where a calculation is made without splitting the above-described first filter is obtained.

Also, the present invention provides, as a second aspect, a signal suppressing apparatus wherein a second filter (2) which electrically simulates a propagation system B through which a value obtained by tabulating calculation results of the filters (11, 12, 13) formed by splitting the first filter (1) is passed so as to exert an influence upon a signal passing the propagation system (A) is provided as another DSP; a signal the same as the signal input to the filters obtained by splitting said first filter is input to the second filter; and the output of said second filter is used for the correction of the coefficients of the filters split from the first filter.

Also, the present invention provides, as a third aspect, a signal suppressing apparatus wherein a second filter (2) electrically simulating the propagation system B is split into a plurality of filters (21, 22); those individual filters are composed by discrete DSP's; outputs are individually calculated at the split individual filters; and the individual calculation results are tabulated, whereby an identical value to the value obtained where a calculation is made without splitting of the second filter is obtained.

Also, the present invention provides, as a fourth aspect, a signal suppressing apparatus wherein, where the tabulated value of the results of calculation of a plurality of filters (21, 22) obtained by splitting of the first filter (1) includes a component of a propagation system C of a path inversely returning to the input side of said first filter, a third filter (3) electrically simulating the propagation system C is composed by another DSP and the influence of propagation of the tabulated value of a plurality of filters (21, 22) through the propagation system C upon the input of said second filter is reduced using the output of said third filter.

Also, the present invention provides, as a fifth aspect, a signal suppressing apparatus wherein a third filter (3) is split into a plurality of filters (31, 32, 33); those individual filters are composed by discrete DSP's; outputs are individually calculated at the individual split filters; and the individual calculation results are tabulated, whereby a value the same as the value obtained where a calculation is made without the splitting of the third filter is obtained.

Also, the present invention provides, as a sixth aspect, a signal suppressing apparatus wherein at least one filter among the first, second, and third filters is composed by an adaptive filter; the coefficient of that filter is corrected using information on error from an intended value so that it is made approximate to the propagation system to be simulated by that filter.

Also, the present invention provides, as a seventh aspect, a signal suppressing apparatus wherein a coefficient updating unit of any filter among the above-described respective filters is commonly used as the coefficient updating unit of the other remaining filters.

Also, the present invention provides, as an eighth aspect, a signal suppressing apparatus wherein, where a convolution operation is carried out in the above-described filters, provision is made of a means for preliminarily executing and storing the operation before new data is input to the filter for a part of the convolution operation which can be performed based on the data already set in the filter; a means for executing a convolution operation after the input of the data for newly input filtering data; and a means for tabulating the above-described stored operation results and newly obtained operation results to obtain the convolution operation result of the filter.

Also, the present invention provides, as a ninth aspect, a signal suppressing apparatus wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

Also, the present invention provides, as a 10th aspect, a signal suppressing apparatus wherein a second filter which simulates the above-described propagation system B is provided; the output of the second filter is transmitted to an initial filter obtained by splitting the first filter; the initial filter stores the input data immediately after the transmission data from the second filter is input, further shifts the position of the address, register, or the like storing the input data whenever the input data are sequentially input, and thereby transfers the thus determined oldest input data to the next filter of the split, and the next filter executes an operation similar to that of the initial filter, and, where a further next filter exists, transfers the oldest input data to that filter, these operations being repeated.

Also, the present invention provides, as an 11th aspect, a signal suppressing apparatus wherein a filter of a simultaneous Chebyshev characteristic is adopted as an anti-aliasing filter used when an error signal for detecting an error of an intended reference signal or that after a suppression of undesired signal is subjected to an analog-to-digital signal conversion, a digital filter receiving as its input a signal after the analog-to-digital signal conversion, a smoothing filter used when the suppression signal of the undesired signal is subjected to a digital-to-analog signal conversion, or a digital filter receiving as its input the signal before the above-described digital-to-analog signal conversion.

FIG. 1 is a view used for an explanation of the principle of the present invention. The method of splitting one filter into a plurality of filters and using the same as adopted in the present invention will be explained below referring to FIG. 1.

It is assumed here that the filter (FIL) is split into three parts and each of them is composed by a discrete DSP. These three DSP's are defined as a DSP "1", DSP "2", and DSP "3", respectively.

As the signal line connections, there are connections such as an input line L1 of a reference signal X1 and an input line L2 of an error information e1 for the DSP "1"; a transmission line L3 of a tap data D12 from the DSP "1" to DSP "2"; a transmission line L4 of a convolution result $YTH_1$ for the DSP "1" to DSP "3"; an input line L5 of the error information e2 for the DSP "2"; a transmission line L6 of the tap data D23 and a transmission line L7 of the convolution result $YTH_2$ for the DSP "2" to DSP "3"; and an input line L8 of the error information e3 and an output line L9 of a convolution summation Σ for the DSP "3". Also, there are filter coefficient updating units U1, U2, and U3 for the respective DSP's, and there are a summation unit S of the respective convolution results from the respective DSP's "1", "2", and "3" and an output unit OUT outputting these summation results from the DSP "3".

As shown in FIG. 1, a single digital filter for simulating one transfer system is composed using a plurality of chips composing the DSP's "1", "2", and "3", the convolution operation is executed by the DSP's "1", "2", and "3", the convolution results of the individual DSP's are transferred to a certain one DSP via transmission lines of convolution information etc. and tabulated, and the convolution summation Σ is computed in that tabulating DSP.

Note that, in FIG. 1, the convolution results of the DSP's are transferred to the DSP "3" having the final taps, but the invention is not limited to this. The destination of the convolution results by the DSP's can be set to any DSP among a plurality of DSP's "1", "2", and "3". It is sufficient so far as the convolution summation is computed by that arbitrarily determined DSP. Alternatively, it is also possible to provide a circuit for computing the convolution summation separately and independently.

Also, the DSP's perform a tap data shift (mentioned later) of the respective digital filters (F1, F2, and F3) of the DSP's in the DSP's after the convolution operation. Particularly for the DSP "1" and DSP "2", as a result of the tap data shift, the final tap data which have become unnecessary and overflow from the tap of the respective digital filters are input to the digital filters realized in the following DSP which is connected in cascade via the transmission line L3 of the tap D12 and the transmission line L6 of the tap data D23. Also, in the final DSP "3", as a result of the tap data shift, the last tap data which has become unnecessary and overflows is discarded or the like.

Accordingly, where the processings according to the DSP's are executed by the above operations, a plurality of DSP's respectively simultaneously operate and perform the processings of convolution, tap data shift, etc. in parallel. Therefore, it becomes possible to perform filtering processing at a high speed.

Further, where the above-described digital filter is constructed by an adaptive digital filter, an error information e1, an error information e2, and an error information e3 are input to the DSP "1", DSP "2", and DSP "3", respectively, and coefficient updating can be carried out in the respective digital filter parts. Accordingly, also in this case, where the processings of the DSP's are executed, a plurality of DSP's simultaneously operate and perform the processings of the convolution, tap data shift, coefficient updating, etc. in parallel, therefore it becomes possible to perform high speed filtering processing.

In the signal suppressing apparatus of the aforesaid first aspect of the invention, since the first filter is composed by a plurality of split filters as mentioned above, the processing speed of that first filter is raised and consequently the processing speed of the signal suppressing apparatus is increased.

In the signal suppressing apparatus of the aforesaid second aspect of the invention, since the second filter is composed by a DSP different from the first filter, the processing in the second filter is completed during a time when the processing at the first filter is carried out. This enables an increase of the processing speed in comparison with a case where the processings at the first and second filters are performed by a single DSP.

In the signal suppressing apparatus of the aforesaid third aspect of the invention, since the second filter is split to a plurality of filters which are composed by discrete DSP's, a further increase of processing speed of the second filter is enabled.

In the signal suppressing apparatus of the aforesaid fourth aspect of the invention, the third filter is composed by another DSP, and the processing in the third filter is completed in a time when the processing is carried out at the aforesaid first filter. This enables an increase of processing speed in comparison with the case where the processings at the first and third filters are performed by a single DSP.

In the signal suppressing apparatus of the aforesaid fifth aspect of the invention, since the aforesaid third filter is split into a plurality of filters which are composed by discrete DSP's, a further increase of the processing speed of the third filter becomes possible In the signal suppressing apparatus of the aforesaid sixth aspect of the invention, since the first, second, and/or third filter is composed by an adaptive filter and a coefficient updating unit thereof is provided, the characteristics of the filter can be made further closer to the transfer system which is to be simulated.

In the signal suppressing apparatus of the aforesaid seventh aspect of the invention, since the coefficient updating unit of any filter is commonly used as the coefficient updating unit of the other remaining filters, a reduction of the size of the software or hardware becomes possible.

In the signal suppressing apparatus of the aforesaid eighth aspect of the invention, since a predetermined range of the convolution operation which can be carried out from the already input data is completed in advance, the amount of operations performed with respect to new data input can be greatly reduced and an increase of the processing speed can be achieved.

In the signal suppressing apparatus of the aforesaid ninth aspect of the invention, since the square cumulative values are found all at once by a single calculation means and they are transferred to the respective split filters, the inefficient practice of having the split filters individually calculate the square cumulative values is eliminated.

In the signal suppressing apparatus of the aforesaid 10th aspect of the invention, since the number of shifts among the aforesaid split filters is made the same, the processing load of the following filter can be reduced.

In the signal suppressing apparatus of the aforesaid 11th aspect of the invention, since irrespective of whether the apparatus is constituted by an analog or digital system, a filter having a simultaneous Chebyshev characteristic is adopted as the anti-aliasing filter or smoothing filter, the group delay can be reduced.

An explanation will be made below of various specific embodiments of the present invention referring to the drawings. Note that, throughout the following drawings, the same reference numerals are given to circuits having the same function.

Figure 2:
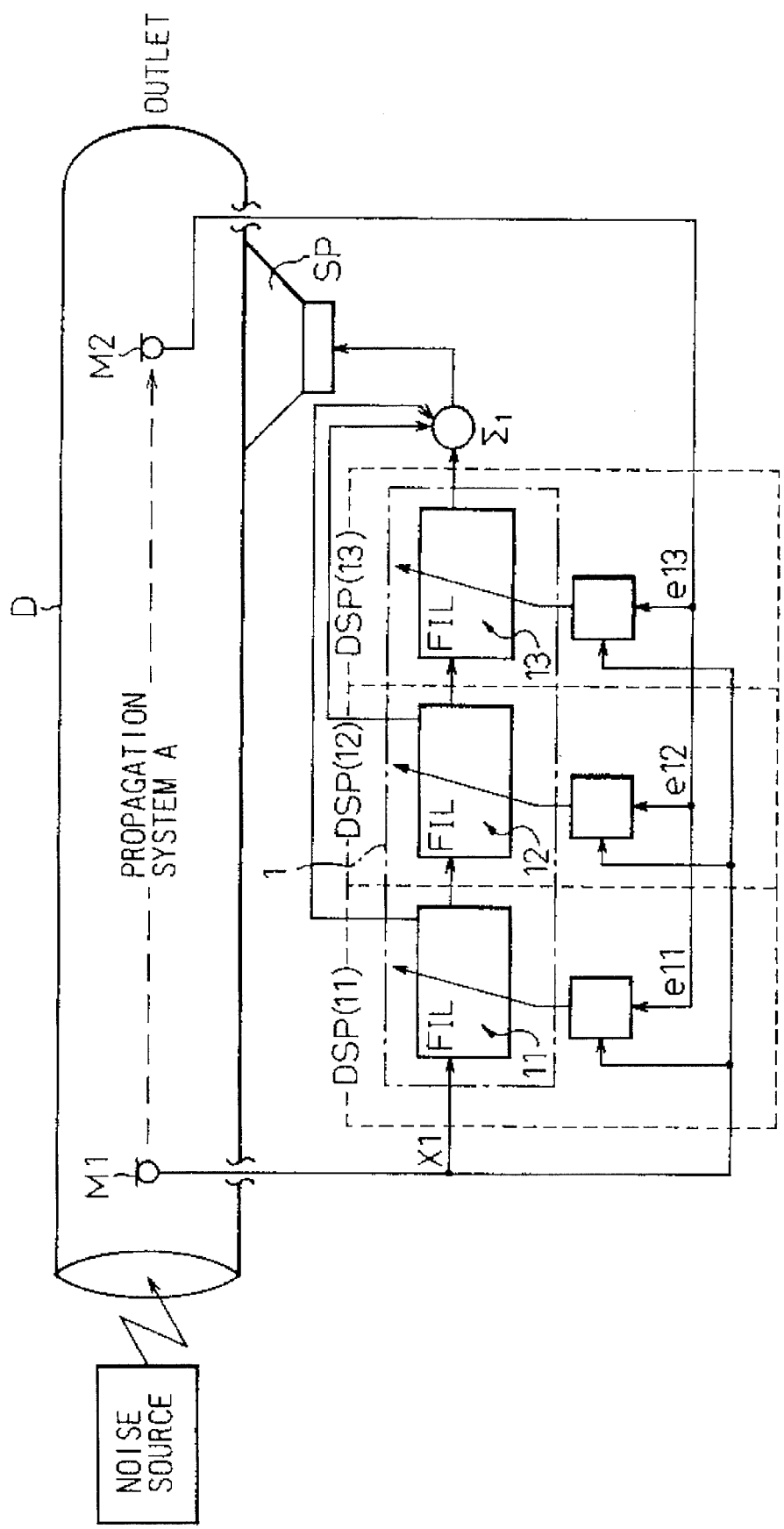
FIG. 2 is a view showing the schematic structure according to a first embodiment of a signal suppressing apparatus of the present invention.

The schematic structure of a signal suppressing apparatus according to a first embodiment of the present invention is shown in FIG. 2, and a detailed structure of an FIR filter part of a major portion of this signal suppressing apparatus is shown in FIGS. 3A, 3B, and 3C. The first embodiment relates to a case where the signal suppressing apparatus of the present invention is applied to an active noise control system. In FIG. 2, M1 is a noise detecting microphone which is mounted on a noise source side and detects the noise; 1 is a canceling FIR filter which creates the sound cancel signal using the noise signal detected at the microphone M1 as a reference signal based on this; SP is a speaker for performing electro-acoustic conversion of the sound cancel signal created at the canceling filter 1, superposing that cancelation sound on noise propagated through the propagation system A such as a duct D to cancel the same; and M2 is an error signal detecting microphone which detects the residual sound (noise minus cancelation sound) which cannot be completely canceled for performing the updating of the filter coefficient of the canceling filter 1.

Figure 4:
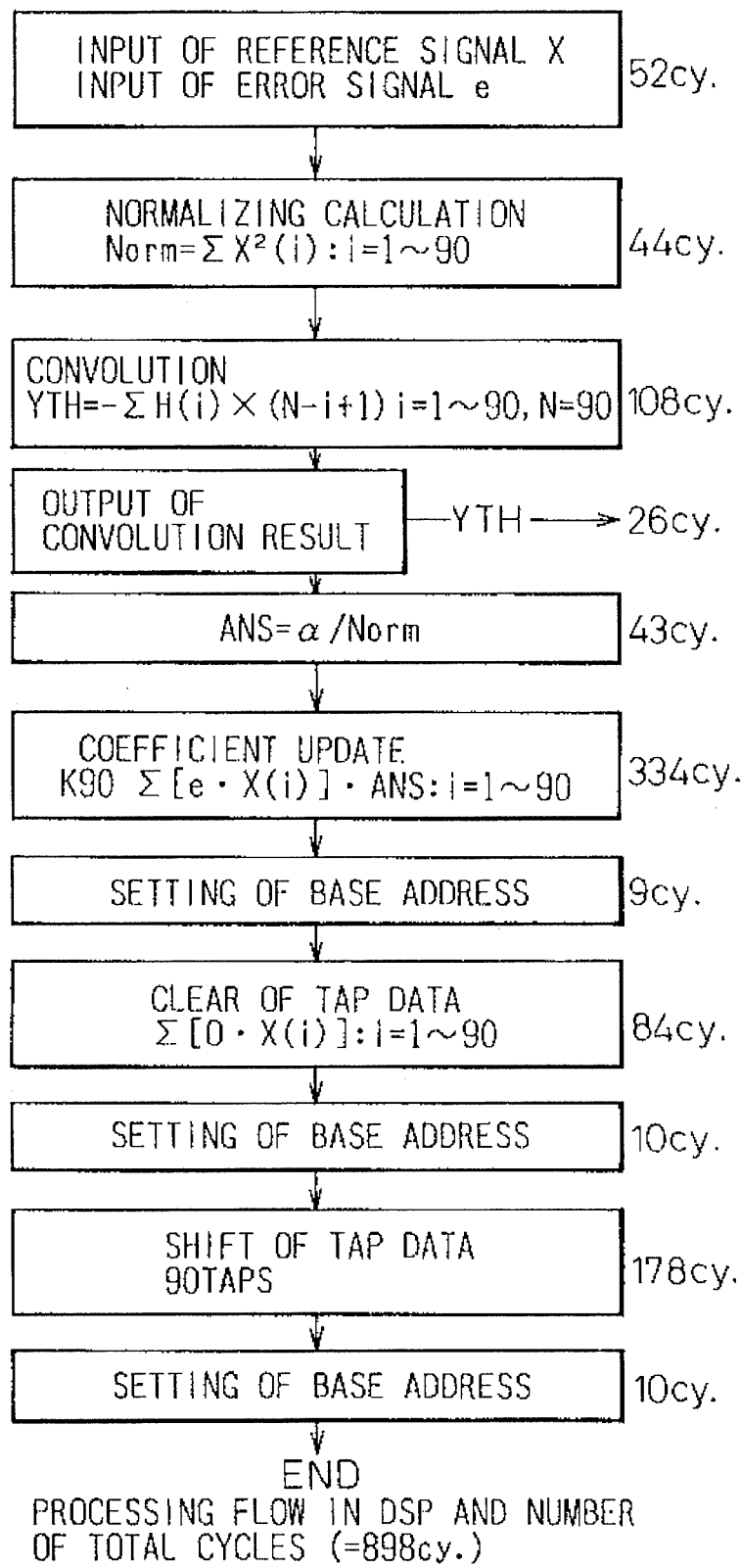
FIG. 4 is a view showing a flow of processing in the DSP of the first embodiment.

Here, the canceling filter 1 simulates the propagation system A acting as the noise propagation path. It is conventionally realized by for example a 90-tap FIR filter. A flow chart of the operation of the conventional type 90-tap FIR filter is shown in FIG. 4. In FIG. 4, X denotes a reference signal; E an error information; H(i) is an FIR filter coefficient; and i an i-th tap; $\Sigma$ represents the summation from i=1 to i=90; and $\alpha$ represents a learning coefficient (step gain). As illustrated, in a case according to the structure of the conventional FIR filter, a processing cycle of for example 898 cycles (cy) is necessary for one series of operations of the input of the reference signal and error signal, Norm operation, convolution operation, convolution result output, ANS (=$\alpha$/Norm) operation, coefficient updating, base address set up, tap data clear, base address set up, tap data shift, base address set up, etc., and the processing time was long.

In the present embodiment, assume that the canceling filter 1 simulating this propagation system A is composed by three canceling filters 11, 12, and 13, and the canceling filters 11, 12, and 13 are realized by discrete (different chips of) DSP's (11), (12), and (13), respectively. Accordingly, the 90 taps of the canceling filter 1 are split into thirds for each of the canceling filters 11, 12, and 13, so the length of the taps of each of the canceling filters 11, 12, and 13 is 30 taps.

In this structure, when the reference signal X1 is input to the canceling filter 11, the following processings are simultaneously executed in the respective canceling filters.

The DSP (11) of the canceling filter (FIL) 11 executes convolution using the coefficient of the canceling filter 11, finds the convolution result $YTH_{11}$ by:

$$YTH_{11}=\Sigma X(i)H(30-i+1)$$

where, i=1 to 30
and transmits this convolution result $YTH_{11}$ to the DSP (13) of the canceling filter 13 by the convolution result transmission line.

The DSP (12) of the canceling filter 12 executes convolution using the coefficient of the canceling filter 12, finds the convolution result $YTH_{12}$ by:

$$YTH_{12}=\Sigma X(30+i)H(60-i+1)$$

where, i=1 to 30
and transmits this convolution result $YTH_{12}$ to the DSP (13) of the canceling filter 13 by the convolution result transmission line.

The DSP (13) of the canceling filter 13 receives the respective convolution results $YTH_{11}$ and $YTH_{12}$ of the FIR filters 11 and 12 via the convolution result transmission lines, respectively. Also, it executes convolution using the coefficient of the canceling filter 13, finds its own convolution result $YTH_{13}$ by:

$$YTH_{13}=\Sigma X(60+i)H(90-i+1)$$

where, i=1 to 30
adds its own convolution result $YTH_{13}$ and the received convolution results $YTH_{11}$ and $YTH_{12}$, and transmits the sum convolution summation $\Sigma_1$ to the outside via the convolution summation output line.

Thereafter, the following operations are carried out.

The canceling filter 11 transmits the last tap data (=X(30)), which becomes unnecessary after the tap data shift, to the canceling filter 12 via the transmission line of the tap data D12.

The canceling filter 12 transmits the last tap data (=X(60)), which becomes unnecessary after the tap data shift, to the canceling filter 13 via the transmission line of the tap data D23.

The canceling filter 13 discards the last tap data (=X(90)), which becomes unnecessary after the tap data shift.

It is also possible to construct each of the canceling filters 11, 12, and 13 simulating the propagation system A of the signal to be suppressed by a filter of fixed tap coefficients or to construct the same by an adaptive filter of variable tap coefficients.

Where it is constructed by an adaptive filter of variable tap coefficients, as the later operation, the error information e11, e12, and e13 are input to the respective DSP's (11), (12), and (13) realizing the canceling filters 11, 12, and 13, respectively, and the updating of the tap coefficients is carried out. These error information e11, e12, and e13 are information for acknowledging to how much extent of error exists in the result controlled using the convolution summation $\Sigma_1$ output from the DSP (13) of the canceling filter 13 with respect to an actual intended data. Concretely, the residual sound which could not be completely canceled as a result of the cancelation sound being superposed from the speaker SP on the noise propagated through the propagation system A is detected by the residual sound detecting microphone M2 to obtain the error information e11, e12, and e13.

The coefficients of the adaptive filter are respectively updated in each of the canceling filters 11, 12, and 13 by these error information. Note that, for the technique of coefficient updating, use is made of an algorithm that establishes feedforward control. As one example of this algorithm, assume that a Normalize LMS (least mean square method), which can be represented by the following equation, is used in the present embodiment and all subsequent embodiments:

$$H_{new}=H_{old}+\alpha \cdot e \cdot X(i)/l\Sigma X^2(i)$$

Note, $H_{new}$ is a filter coefficient after updating, and $H_{old}$ is a filter coefficient before updating.

In the above-mentioned embodiment, the canceling filters 11, 12, and 13 are realized by the DSP's (11), (12), and (13) of discrete chips, respectively, and the number of DSP's was defined as three in total, but the number of the DSP's, that is, the number of the split canceling filters 1, is not restricted to that of the embodiment. Needless to say the apparatus can be realized even if the number is not particularly three, so far as the number is a plural number of 2 or more.

Also, in the above-mentioned embodiment, the convolution results $YTH_{11}$, $YTH_{12}$, and $YTH_{13}$ from the canceling filters 11, 12, and 13 were tabulated at the DSP (13) using the FIR filter 13 to compute the summation $\Sigma i$, but the DSP performing the tabulation and summation of the convolution results is not particularly restricted to the DSP (13) of the canceling filter 13 and may be any arbitrary one among the three DSP's (11), (12), and (13) realizing the canceling filters 11, 12, and 13.

In this way, in the present embodiment, one series of operations of the canceling filter 1 (convolution→coefficient updating→tap data shift) which had been conventionally always executed by one DSP can be processed faster by splitting the canceling filter 1 into the three canceling filters 11, 12, and 13, realizing the respective filters by discrete DSP's (11), (12), and (13), and simultaneously operating the respective DSP's in parallel. Therefore, in contrast to conventional processing in which 898 cy has been required as shown in FIG. 4, in this embodiment, the processing time can be reduced to for example about 400 to 500 cy as shown in FIGS. 3A to 3C. That is, the time from when the reference signal X1 is input to the canceling filters 11, 12, and 13 composed by the DSP's (11), (12), and (13) to when the convolution summation $\Sigma i$ after processing is obtained can be shortened.

Moreover, the information transferred among the DSP's (11), (12), and (13) realizing the canceling filters 11, 12, and 13 is information of about 1 to 2 bytes, therefore the transfer of that information can be carried out at a high speed by a parallel interface etc. Accordingly, the time delay of the information transfer will not obstruct realization of the present signal suppressing apparatus.

FIG. 5 shows the schematic structure of a second embodiment of the present invention; and FIG. 6 shows a detailed processing procedure in the parts of the FIR filters 1 and 2 serving as the major portions of the apparatus of this embodiment. Also, this embodiment shows a case where the signal suppressing apparatus of the present invention is applied to an active noise control system.

In the above-mentioned embodiment, the canceling filter 1 obtains the reference signal X1 directly from the outside (that is, obtains it directly from the microphone M1) and inputs this directly to the initial split canceling filter 11. Also this structure is possible if it is used for a simple signal suppressing apparatus, but when it is used for the processing system of an active noise control system, active vibration control system, etc., there are cases where the output of the canceling filter cannot be made approximate to the target value more correctly without interposition of a certain propagation system.

For example, as shown in FIG. 5, in the active noise control system, it is not possible to superpose the output from the canceling filter 1 on to the noise to be canceled without interposition of the propagation system B including the speaker SP etc. For this reason, unless the propagation system B from the output of the canceling filter 1, passing the speaker SP and the residual sound detecting microphone M2 and returning to the error information input of the canceling filter 1, is simulated in addition to the simulation of the propagation system A of noise by the canceling filter 1, a more accurate noise cancelation cannot be carried out.

Therefore, in the second embodiment of FIG. 5, the influence by this propagation system B is considered by the technique of a filtered—X algorithm used in the active noise control system or active vibration control system, etc.(B. Widrow and S. D. Stearns: "Adaptive Signal Processing", Englewood Cliffs, N.J. Printice as a reference document).

Namely, as shown in FIG. 5, a reference signal (noise) detected by the noise detecting microphone M1 is input to the FIR filter 2 simulating the propagation system B, and the coefficient updating of the canceling filter 1 is modified based on information X' which is output from that filter. Here, $$X'=\Sigma X(i)H_2(90-i+1)$$

Note, in the same way as that mentioned before, X(i) is a reference signal and $H_2(i)$ is a filter coefficient of the FIR filter 2; and i represents the i-th tap, and $\Sigma$ represents the summation from i=1 to i=90.

In this way, the propagation system B is simulated by the FIR filter 2 separately from the propagation system A which should be simulated by the canceling filter 1. So as to realize this FIR filter 2, a DSP (2) on a chip different from that for the three DSP's (11), (12), and (13) realizing the already mentioned canceling filters 11, 12, and 13, respectively, is provided, and the FIR filter 2 is formed in this DSP (2). Transfer of information is carried out by the signal lines mentioned below among the DSP's including the respective filters.

As the connection of the signal lines, as shown in FIGS. 6A, 6B, and 6C, there are:

an input line L10 of a reference signal X2 and an input signal line L11 of an error information e2 for the DSP (2) forming the FIR filter 2;

a transmission line L12 of a reference signal X1 and a transmission line L13 of an information X' from the DSP (2) forming the FIR filter 2 to the DSP (11) of the canceling filter 11;

a transmission line of the information X' from the DSP (2) forming the FIR filter 2 to the DSP (12) of the canceling filter 12; and a transmission line L14 of the information X' from the DSP (2) forming the FIR filter 2 to the DSP (13) of the canceling filter 13. Signal lines other than those described above are the same as those in the first embodiment of FIG. 2 mentioned before. Also, the input line of the reference signal X1 with respect to the DSP (11) forming the FIR filter 11 in the first embodiment of FIG. 2 is connected to the transmission line L12 of the reference signal X01 from the DSP (2) forming the FIR filter 2 to the DSP (11) of the FIR filter 11 in the present embodiment.

When the reference signal X2 is input to the DSP (2) of the FIR filter 2, the following processings are executed.

The DSP (2) of the FIR filter 2 executes convolution with respect to the reference signal X2 input using the coefficient of the FIR filter 2, and then performs the transmission of the reference signal considering the influence of the propagation system B to the DSP (11) of the canceling filter 11 by the transmission line of the information X' (L13).

Where the reference signal is sent from the DSP (2) forming the FIR filter 2 to the DSP (11) of the canceling filter 11 via the transmission line of the reference signal X01, the operation mentioned in the above-mentioned embodiment (1) is carried out simultaneously also at the respective DSP's DSP (11), (12), and (13) of the FIR filters 11, 12, and 13. Moreover, the following operations are the same as those in the above-mentioned first embodiment. Also an operation in a case where the canceling filter 1 simulating the propagation system A is an adaptive filter of variable tap coefficients is as in the above-mentioned first embodiment.

Further, it is also possible to construct the above-mentioned FIR filter 2 by an FIR filter of fixed tap coefficients or construct the same by an adaptive filter of variable tap coefficients. Where it is constructed by an adaptive filter of variable tap coefficients, the error information e2 is input to the FIR filter 2, and the coefficient updating of the adaptive filter by this FIR filter 2 is carried out using an algorithm enabling feedforward control to be established in the same way as the updatings of the canceling filters 11, 12, and 13. Note that, during a time when the updating of the coefficients for adaptation of the FIR filter 2 is being carried out, it is necessary to stop the processings of the other canceling filters 11, 12, and 13.

Figure 12:
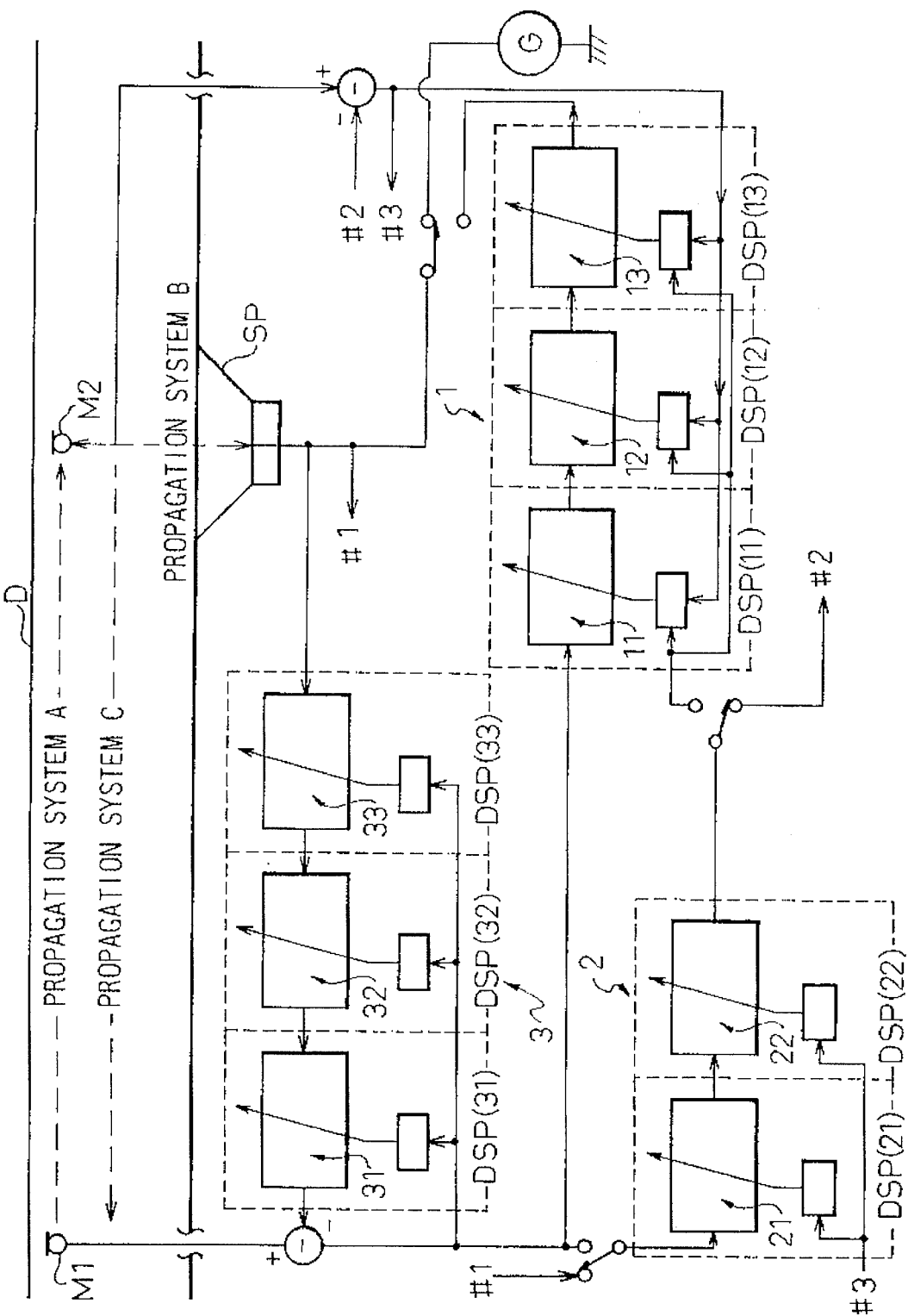
FIG. 12 is a view for explaining an adaptive operation of the filter in the embodiments.

Here, FIG. 12 will be referred to for convenience of the explanation. FIG. 12 is a view explaining a method of updating of the tap coefficient where the FIR filter 2 is constructed by an adaptive filter as mentioned above. A generator G which generates broadband noise signals is prepared. At the time of updating of the coefficients of the FIR filter 2, the output signal from the generator G in place of the output signals of the canceling filters 11, 12, and 13 is applied to the speaker SP and, at the same time, input also to the FIR filter 2 as the reference signal (#1). On the other hand, a residual sound is detected by the microphone M2 to find a difference (#3) between the detected value thereof and the output (#2) of the FIR filter 2. This is defined as the error information (#3) of the FIR filter 2. By this, the tap coefficients of the filter 2 are updated so that the error information (#3) becomes the minimum.

In this way, in the present embodiment, a series of operations (convolution→coefficient updating→tap data shift) of the FIR filters 1 and 2 which respectively simulate the propagation system A and propagation system B in a system controlled by the filtered - X algorithm technique or the like used in an active noise control system, active vibration control system, or the like, which has been conventionally always executed by one DSP, can be processed in parallel by splitting the filter into four DSP's (11), (12), (13), and (2) and making them simultaneously operate. Accordingly, during a time from when the reference signal X1 is input to the FIR filter 1 constructed by the DSP's (11), (12), and (13) to when it is processed and the convolution summation $\Sigma_1$ is obtained, in the FIR filter 2, one series of operations (convolution→coefficient updating→tap data shift) with respect to the signal propagated through the propagation system B can be executed, and therefore as a whole the time of the processing by the DSP can be shortened by that amount.

Figure 7:
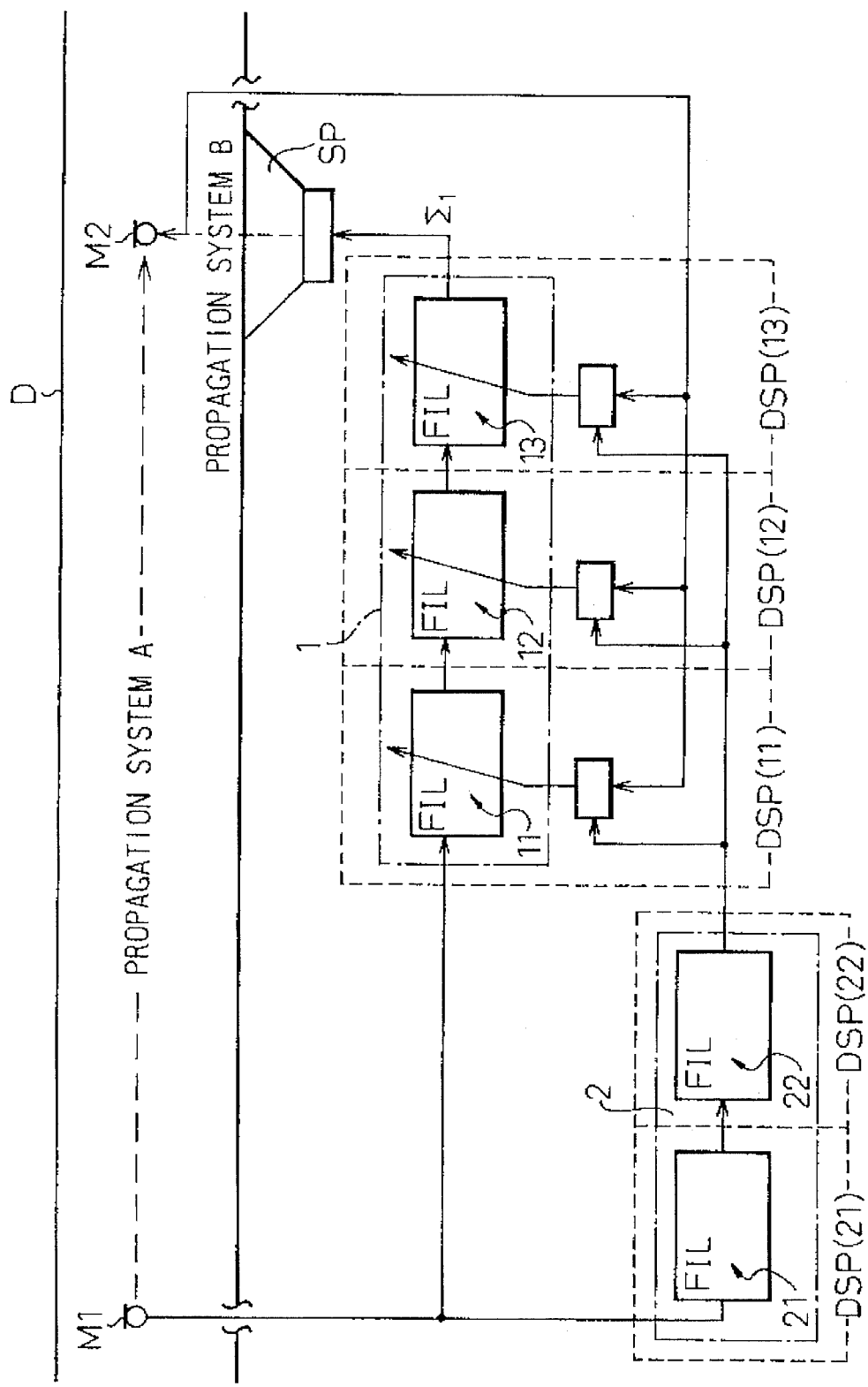
FIG. 7 is a view showing the schematic structure according to a third embodiment of the signal suppressing apparatus of the present invention.

Here, returning to FIG. 7 for the explanation, FIG. 7 shows a schematic structure of the third embodiment of the present invention. The detailed processing procedure at the FIR filter part which is a major portion of the apparatus according to this third embodiment is shown in FIGS. 8A, 8B, and 8C. In the second embodiment of FIG. 5 mentioned before, the FIR filter 2 was constructed using a single DSP (2), but it is also possible even if the number of the DSP's used for realizing the FIR filter 2, that is, the number of the split FIR filters 2, is not particularly restricted to one chip. By realizing this FIR filter 2 using two or more DSP's, the processing speed of the FIR filter 2 can be further increased. FIG. 7 shows such the third embodiment in which the FIR filter 2 is realized by two DSP's.

As illustrated, the FIR filter 2 is composed by two filters, that is, the FIR filters 21 and 22. The respective FIR filters 21 and 22 are realized by discrete DSP's (21) and (22). The convolution result $YTH_{21}$ and the tap data D21 are transmitted from the FIR filter 21 to the FIR filter 22. In this way, the processing of the FIR filter 2 is dispersed to the FIR filters 21 and 22. FIGS. 8A to 8B show the processing in the respective FIR filters in that case.

In FIGS. 8A to 8C, the tap length of the FIR filter 2 is split into a half for each of the FIR filters 21 and 22, and part of the processing of the FIR filter 2 is carried out dispersed to the FIR filters 21 and 22. It is also possible if the proportion of this split is arbitrary, but in the present embodiment, it is assumed that the total tap length of the FIR filter 4 is 90 taps and that this is split into two for the FIR filters 21 and 22, each of which ends up having a 45-tap length.

The operation of the canceling filter 1 is the same as that in the aforementioned first and second embodiments. The DSP's constructing the respective FIR filters 11, 12, 13, 21, and 22 perform the transfer of information by the following signal lines. Note, the description is omitted for the transfer of information similar to that in the aforementioned embodiments.

There are a transmission line L20 of the convolution result X' from the DSP (22) of the FIR filter 22 to the DSP (11) forming the FIR filter 11;

a transmission line L21 of the convolution result $YTH_{21}$ and the transmission line L22 of the tap data D21 for the DSP (21) of the FIR filter 21 to the DSP (22) of the FIR filter 22;

an input line of the error information e21 and an input line L23 of the reference signal X2 for the DSP (21) of the FIR filter 21; and an input line L24 of the error information e22 for the DSP (22) of the FIR filter 22.

Also, the input line of the reference signal X1 to the DSP (11) of the canceling filter 11 in the first and second embodiments is connected to the transmission line of the reference signal X2 at the DSP (21) of the canceling filter 21 in the present embodiment. When the reference signal X2 is input to the DSP (21) forming the FIR filter 21, the following processings are executed.

The DSP (21) forming the FIR filter 21 executes convolution using the input reference signal X2 and the coefficients of the FIR filter 21 and finds the convolution result $YTH_{21}$ by:

$$YTH_{21}=\Sigma X(i)H(45-i+1)$$

where, i=1 to 45
and thereafter transmits the convolution result $YTH_{21}$ to the DSP (22) of the FIR filter 22 via the convolution information transmission line L21.

Also, the DSP (22) of the FIR filter 22 executes convolution using the tap data input to the FIR filter 22 and using the coefficients of the FIR filter 22 from the FIR filter 21 via the tap data transmission line L22 and finds the convolution result $YTH_{22}$ by:

$$YTH_{22}=\Sigma X(45+i)H(90-i+1)$$

where, i=1 to 45

Thereafter, this convolution result $YTH_{22}$ and the convolution result $YTH_{21}$ of the FIR filter 21 received via the convolution information transmission line L21 are added and the convolution summation $\Sigma_2$ thereof is transmitted as the information X' to the DSP (11) of the canceling filter 11 via the transmission line L20 of the convolution result X'.

The operations of the respective DSP's (11), (12), and (13) constituting the canceling filter 1 after sending the summation $\Sigma_2$ of the respective convolution results of the FIR filter 21 and the FIR filter 22 from the FIR filter 22 to the canceling filter 11 via the transmission line L20 of the convolution result X' are similar to the operations mentioned in the aforementioned first embodiment.

Also in the same way as in the case of the first embodiment mentioned above, the FIR filters 21 and 22 simulating the propagation system B can be constructed by filters of fixed coefficients and can be constructed by adaptive filters of variable tap coefficients. As the operations in the case where the FIR filters 21 and 22 are constructed by adaptive filters of variable tap coefficients, processings such as the Norm operation, ANS operation, coefficient updating, tap data clearing, tap data shift etc. are carried out in both the DSP's (21) and (22) of the FIR filters 21 and 22 using the error information e21 and e22, and the respective coefficients of the FIR filters 21 and 22 constituting the adaptive filter are updated.

Note that, in the example shown in FIG. 7 and FIGS. 8A to 8C, it is necessary to stop the respective processings of the DSP's (11), (12), and (13) of the other canceling filters 11, 12, and 13 during a time when an operation of applying adaptation to the FIR filters 21 and 22 is carried out. However, a broadband signal having no correlation to the reference signal from the output of the microphone M1 is mixed from a secondary source, i.e., a speaker SP, to the suppressing signal to be input to the secondary source SP. An adaptive filter operating so as to minimize the above-described broadband signal received at the microphone M1 is provided, whereby it becomes easy to perform also the adaptation of the FIR filters 11, 12, and 13 simultaneously with the adaptation of the FIR filters 21 and 22.

In the present embodiment, the FIR filter 2 simulating the propagation system B, that is, the FIR filters 21 and 22, was realized by two DSP's (21) and (22), but needless to say the number of DSP's, that is, the number of split FIR filters 2, is not particularly restricted to two as in the above-mentioned embodiment, but may be two or more chips.

In the present embodiment, in the same way as in the above-mentioned embodiments, one series of operations (convolution→coefficient updating→tap data shift) of two FIR filters simulating the propagation system A and the propagation system B can be simultaneously performed in parallel by splitting the filter into five DSP's (11), (12), (13), (21), and (22). Accordingly, during a time from when the reference signal X1 is input to the FIR filter 1 constructed by the DSP's (11), (12), and (13) to when it is processed and the convolution summation $\Sigma_1$ is obtained, one series of operations of the canceling filter 1 (convolution→coefficient updating→tap data shift) for simulating the propagation system B can be executed in two DSP's (21) and (22) forming the FIR filter 2, and therefore the time of processing by the DSP's can be shortened as a whole by that amount.

Figure 9:
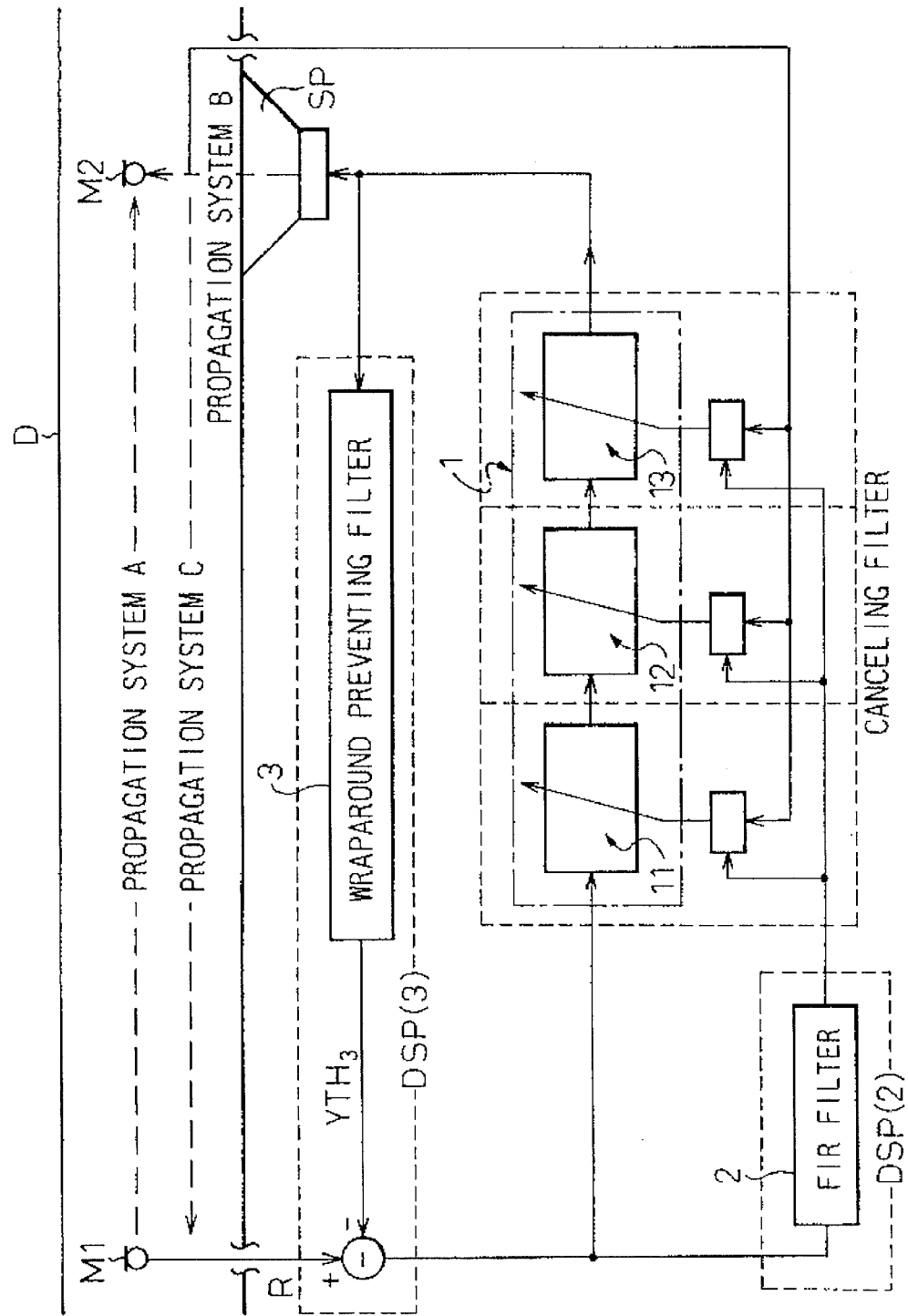
FIG. 9 is a view showing a fourth embodiment of the signal suppressing apparatus of the present invention.
Figure 10A:
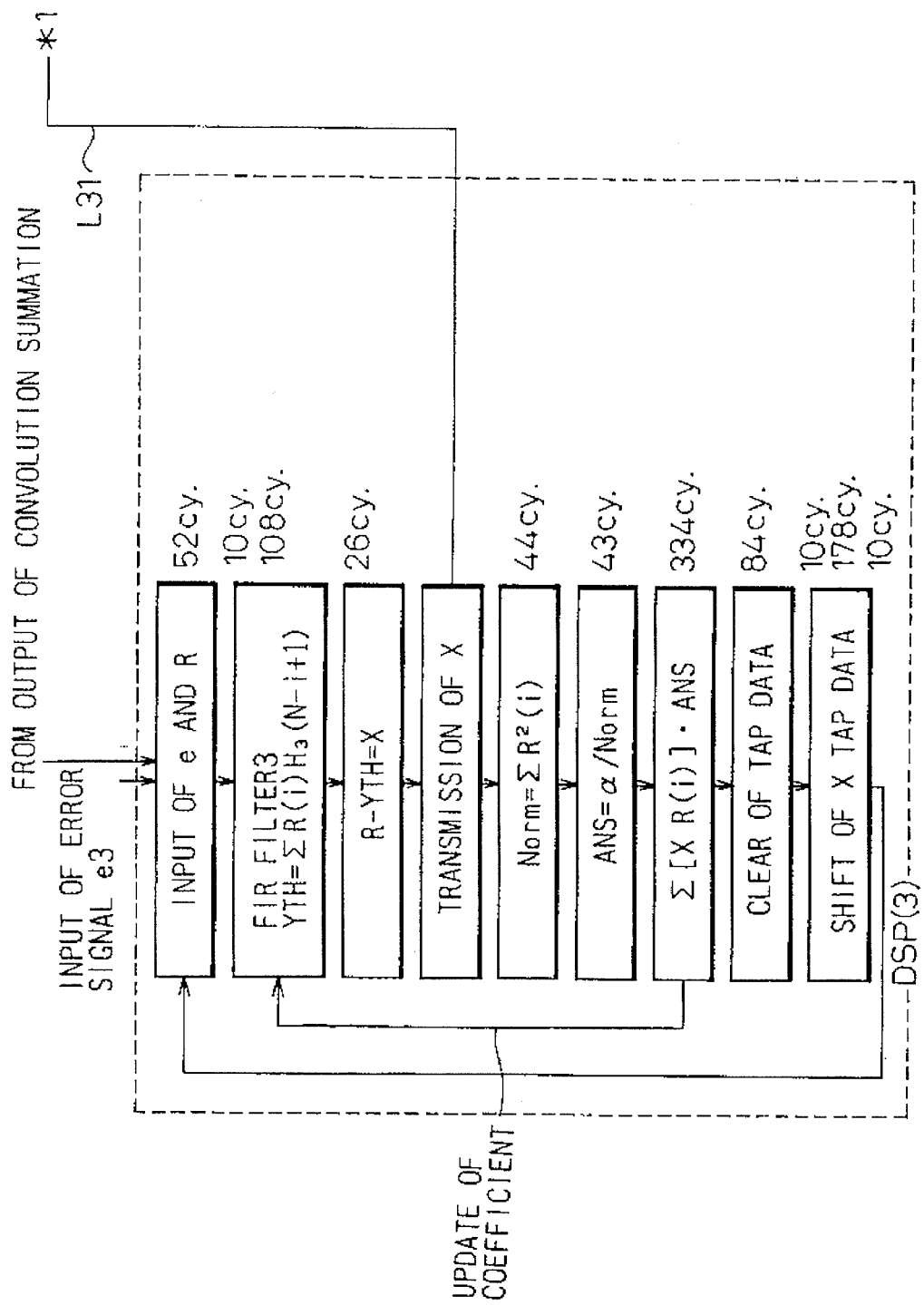

FIG. 9 shows the schematic structure of further fourth embodiment of the present invention, and FIGS. 10A, 10B, and 10C show a detailed processing procedure at the FIR filtering part serving as the major portion of the apparatus according to this fourth embodiment. In this fourth embodiment as well, the signal suppressing apparatus of the present invention is applied to an active noise control system.

In the processing system of the above-described first, second, and third embodiments, the output of the canceling filter can follow a path returning it in reverse through the propagation system A simulated by the canceling filters 11, 12, and 13. There is little chance that the transfer function of the path in that case will be the same as the transfer function A of the path simulated by the canceling filter.

For example, in the above-mentioned active noise control system, where it is assumed that the noise detecting microphone M1 for obtaining the reference signal (noise to be canceled) is an omnidirectional microphone, there is a possibility that the cancelation sound electrically simulated by the cancelation filter 1 will move reversely through the propagation path of noise from the speaker SP side to the omnidirectional microphone M1 and wraps around to the input side of the cancelation filter 1. The creation of the correct cancelation sound at the cancelation filter 1 is prevented by the influence of the wraparound sound following this wraparound path (propagation system C). Therefore, it is possible to eliminate the influence of this wraparound path (propagation system C) by providing the wraparound preventing filter 3 simulating this propagation system C (see, for example, Kosaka and Yamada, Technical Report EA 88–26, pp. 14 to 16 of the Electronics Information and Communication Institute, JAPAN 1988), returning the cancelation sound signal output from the cancelation filter 1 via this wraparound preventing filter 3 to the input side of the cancelation filter 1, subtracting the wraparound sound from the detection signal of the microphone M1 and then input the result to the FIR filter 1.

Also, a similar phenomenon occurs also in a case of the active vibration control system etc. In this active vibration control system, there sometimes occurs a case where a vibration from a vibration cancelation actuator is propagated to a vibration pickup for obtaining the reference signal and the influence of this must be eliminated.

In this way, in an active noise control system, active vibration control system, and the like, it is necessary to provide a wraparound preventing filter 3 for simulating the propagation system C equivalent to the above-described wraparound path (here, assuming a uniform interpretation based on the acoustic concept). Accordingly, a sixth DSP is further employed other than the five DSP's realizing the canceling filters 11, 12, and 13 simulating the propagation system A used in the above-described embodiments (1), (2), and (3) and the FIR filters 21 and 22 simulating the propagation system B, respectively. The wraparound preventing filter 3 consisting of the FIR filter simulating the wraparound path is realized by this sixth DSP.

The structure in this case is shown in FIG. 9. The transfer of information is carried out by the following signal line among the DSP's forming the respective FIR filters. Namely, there is an input line L30 of the reference signal R3 coupled to the DSP (3) forming the wraparound preventing filter 3.

Signal lines other than the above are the same as the signal lines used in the above-mentioned first to third embodiments.

When the reference signal R3 is input to the DSP (3) of the wraparound preventing filter 3, the following processings are executed.

The DSP (3) of the FIR filter 3 executes convolution using the reference signal R3 which is input and the coefficients of the FIR filter 3 and finds the convolution result $YTH_3$ of the wraparound component:

$$YTH_3 = \Sigma R(i) H_3(N-i+1)$$

and then finds the reference signal X freed from influence of the propagation system C by:

$$R - YTH_3 = X$$

and performs the transmission of this reference signal X03 to the DSP (21) of the FIR filter 21 via the transmission line L31 of the reference signal X03.

Where the reference signal X03 is sent from the DSP (3) of the wraparound preventing filter 3 to the DSP (2) of the FIR filter 2, operations similar to those mentioned in the above-mentioned first to second embodiments are carried out simultaneously also in the DSP's (11), (12), and (13). Moreover, the following operations are the same as those in the above-mentioned first and second embodiments.

Moreover, it is also possible to comprise the wraparound preventing filter 3 by a filter of fixed coefficients or by an adaptive filter of the variable tap coefficients. Where it is comprised by an adaptive filter of the variable tap coefficients, the error information can be input to the DSP (3) realizing the wraparound preventing filter 3 or the difference found by this DSP (3) can be defined as an error. The updating of coefficients is carried out using an algorithm enabling establishment of feedforward control similar to a case where the coefficients of the adaptive filter are updated in each of the canceling filters 11, 12, and 13.

Figure 11:
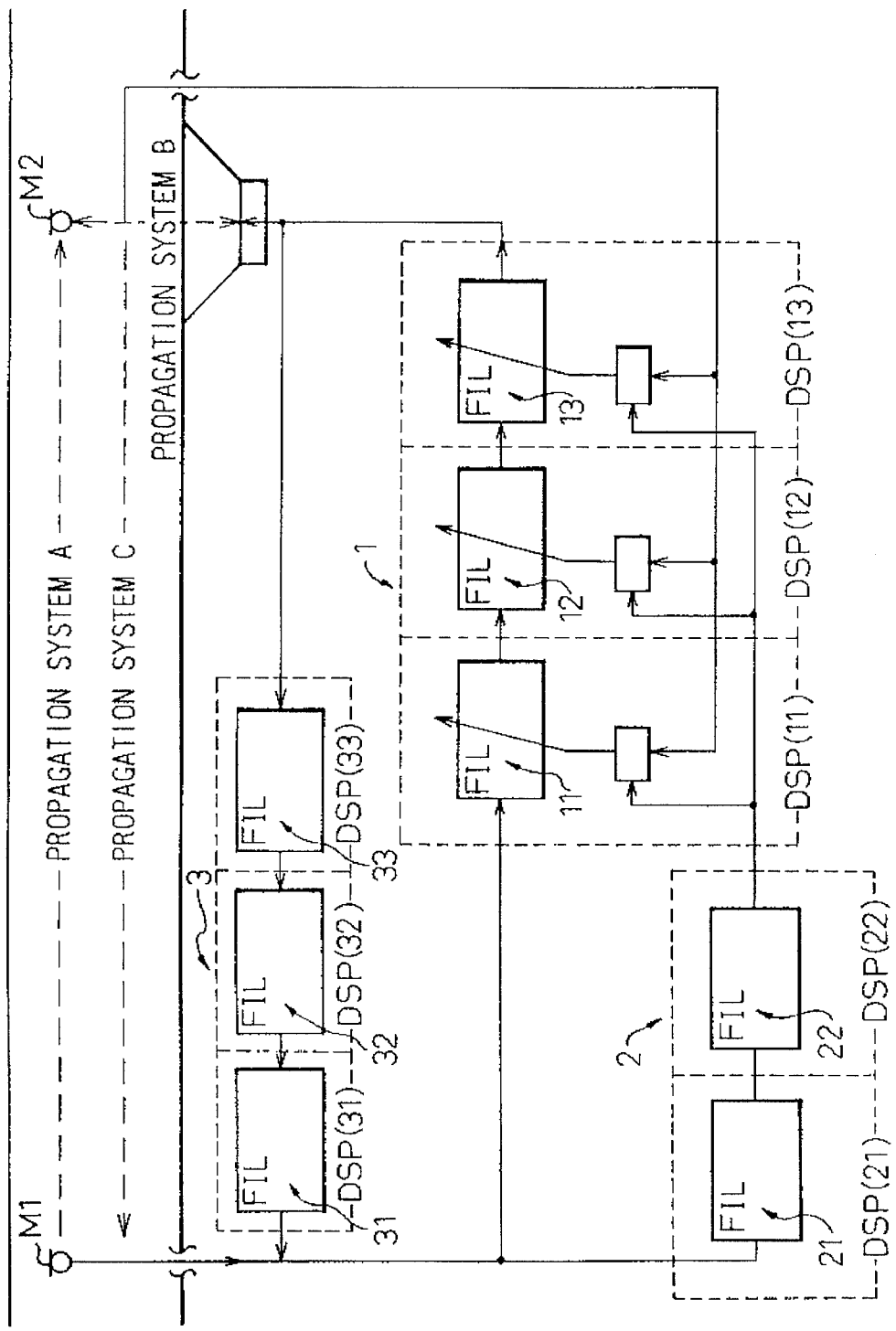
FIG. 11 is a view showing a modified example of the fourth embodiment of the present invention.

In this embodiment, the wraparound preventing filter 3 was constructed using one DSP, but needless to say the number of the DSP's constructing the wraparound preventing filter 3, that is, the number of split wraparound preventing filters 3 can be realized by splitting the wraparound preventing filter 3 into two or more chips similar to the case of the FIR filters 1 and 2 of the above-mentioned embodiments, etc. Moreover, also in the embodiment of FIG. 9, it is of course possible even if the FIR filter 2 is realized by splitting the same into a plurality of DSP chips. For example, FIG. 11 shows a case where the FIR filter 2 is realized by two DSP's (21) and (22) as the filters 21 and 22 and the wraparound preventing filter 3 is realized by the three DSP's (31), (32), and (33) as the filters 31, 32, and 33 as an example of such a case.

In this way, in this embodiment, where control is carried out by a filtered—X algorithm or the like used in the active noise control, active vibration control, or the like which has been conventionally always executed by one DSP, one series of operations (convolution→coefficient updating→tap data shift) of three FIR filters (1, 2, 3) which simulate the paths of the propagation system A, the propagation system B, and the propagation system C can be simultaneously processed by splitting the filter into five DSP's (11), (12), (13), (2), and (3). Accordingly, during a time from when the reference signal X1 is input to the FIR filter 1 constructed by the DSP's (11), (12), and (13) to when it is processed and the convolution summation $\Sigma_1$ is obtained, one series of operations (convolution→coefficient updating→tap data shift) for the propagation system B can be executed in the DSP (2) of the filter 2 and one series of operations (convolution→ coefficient updating→tap data shift) for the propagation system C can be executed in the DSP (3) of the wraparound preventing filter 3, and therefore the processing time by the DSP's can be shortened by that amount as a whole.

Figure 13:
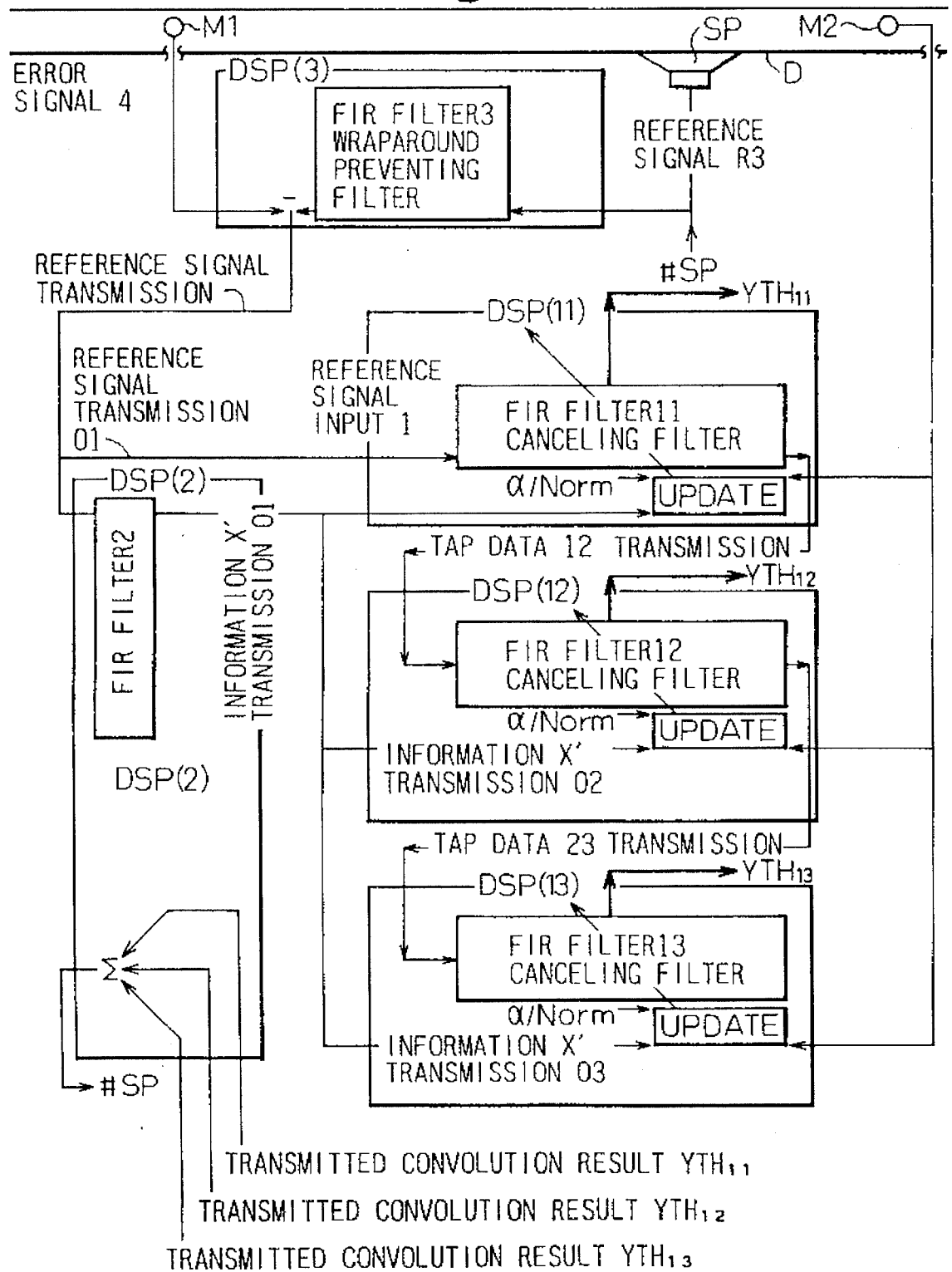
FIG. 13 is a view showing a fifth embodiment of the signal suppressing apparatus of the present invention.

FIGS. 13, 14, 15, and 16 show a further fifth embodiment of the present invention. This fifth embodiment is aimed at reduction of the size and increase of the speed of the FIR filters. FIG. 13 is a view showing a case where the DSP's (11), (12), and (13) always perform an adaptive operation.

Namely, where no influence can be applied to the signal after passing the propagation system A by the convolution summation $\Sigma_1$ produced and output from the canceling filters 11, 12, and 13 constructed by the DSP's (11), (12), and (13) without going through the propagation system B as in the processing systems of the above-mentioned second and third embodiments, an FIR filter 2 electrically simulating the propagation system B in that processing system is employed in that processing system. In this case, so as to achieve the coefficient updating of the FIR filter 2, it is necessary to employ the coefficient updating unit of the filter in the DSP (2) realizing the FIR filter 2. In this way, when the FIR filter 2 and the coefficient updating unit thereof are employed in the DSP (2), the DSP (2) must perform both processings and therefore has to handle an increased load.

The same is true also for a case of the processing system of the fourth embodiment. Namely, where provision is made of a path in which the convolution summation $\Sigma_1$ formed and output from the DSP's (11), (12), and (13) moves reversely through the propagation system A simulated by the canceling filters 11, 12, and 13 as the processing system of this fourth embodiment, that processing system will have the wraparound preventing filter 3 simulating this path. However, so as to perform the coefficient updating for this wraparound preventing filter 3, it is necessary to employ the coefficient updating unit in the DSP (3) constructing the wraparound preventing filter 3. In this way, when the wraparound preventing filter 3 and the coefficient updating unit thereof are employed in the DSP (3), as a result, the processing of these two will increase the load of the DSP (3).

In this way, in the above-mentioned embodiments, each DSP (11) among the DSP's (11), (12), (13), the DSP (2), and the DSP (3) has an FIR filter and a coefficient updating unit therefor inside and therefore there is a defect that the scale of the signal suppressing apparatus is enlarged as a whole.

Therefore, in the fifth embodiment, the coefficient updating unit is not provided inside the DSP (2) forming the FIR filter 2 or the DSP (3) forming the wraparound preventing filter 3. Instead, the coefficient updating units of the DSP's (11), (12) and (13) are used commonly for each of the coefficient updating for the FIR filter 2 inside the DSP (2) and the coefficient updating for the wraparound preventing FIR filter 3 inside the DSP (2).

So as to simplify and realize the preceding fourth embodiment, the figure was redrawn to that of FIG. 13 in the form of a block diagram. According to the structure of FIG. 13, only an FIR filter 2 exists in the DSP (2)—there is no coefficient updating unit. Further, only the wraparound preventing filter 3 exists in the DSP (3)—there is also no coefficient updating unit. Note, it is necessary to perform advance learning of coefficients using the coefficient updating unit in each of these FIR filter 2 and wraparound preventing filter 3. However, if a broadband signal having no correlation to the reference signal and error signal to be detected at the noise detecting microphones M1 and M2, respectively, is mixed into the secondary source SP and an adaptive filter receiving as its input this broadband signal is separately provided, it is also easy to learn coefficients not in advance, but during the control.

Figure 15:
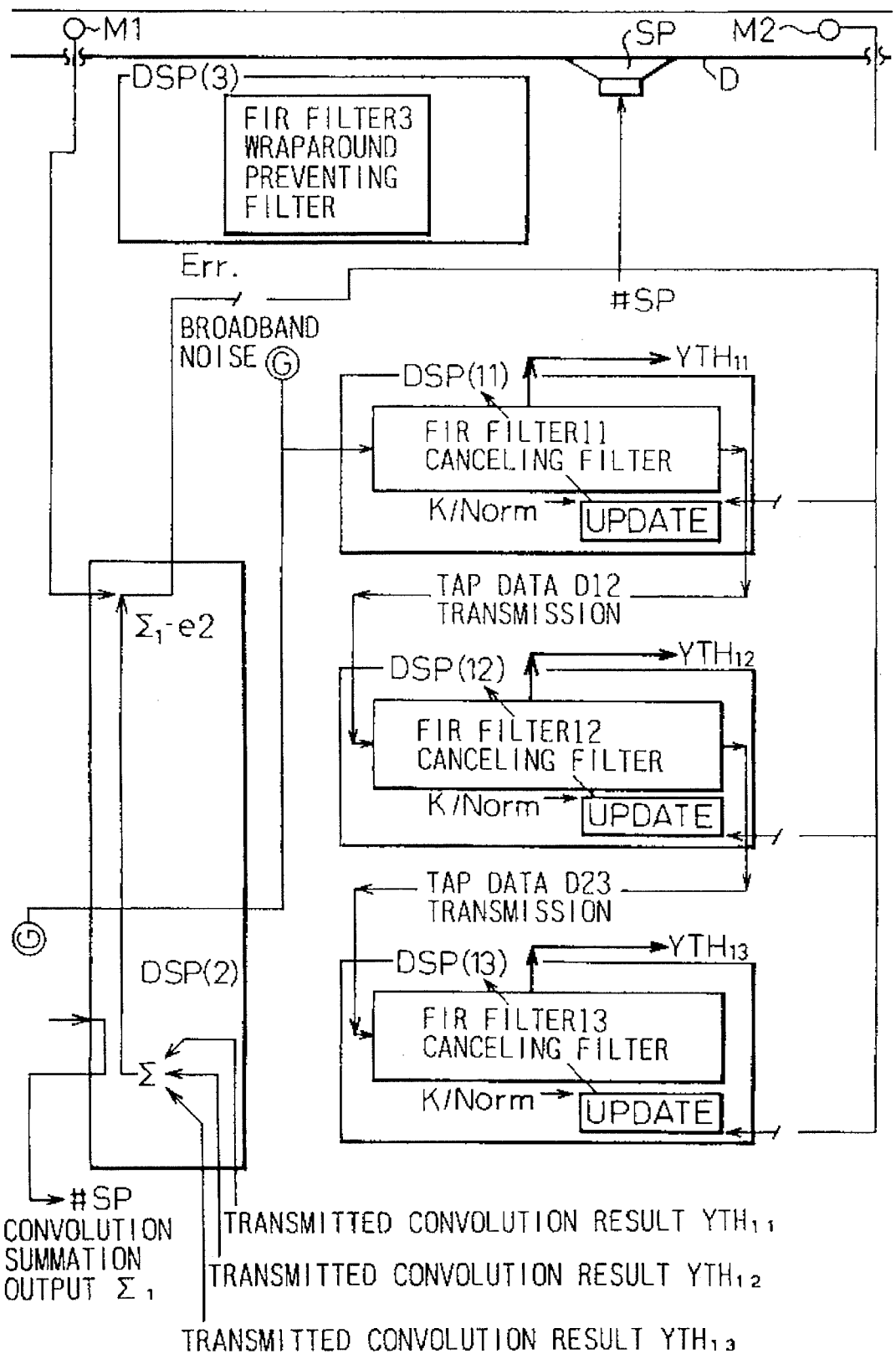
FIG. 15 is a view explaining another operation in the fifth embodiment of the signal suppressing apparatus of the present invention.

It is assumed first that advance learning of the coefficients for the wraparound preventing filter 3 in the DSP (3) is carried out using the respective coefficient updating units of the DSP's (11), (12), and (13). FIG. 15 shows the detailed state of this case.

A generator G is provided which generates the broadband noise signal. The broadband noise signal thereof is input to the secondary source (speaker SP, the same also for the following). At the same time, an identical signal is input also to the DSP (11). The data of this broadband noise signal is sequentially input also to the filters 12 and 13 by a tap data shift inside the filter 11.

Also, individual convolution results $YTH_{11}$, $YTH_{12}$, and $YTH_{13}$ of the filters 11, 12, and 13 are tabulated in the DSP (2) using the convolution result transmission line (see FIG. 16), they are summed up, and the convolution summation output $\Sigma_1$ is formed.

On the other hand, the broadband noise released from the secondary source (SP) is propagated through the duct D in a reverse direction (that is in the propagation system C) and wraps around the noise detecting microphone M1. The output of this noise detecting microphone M1 is input to the DSP (2) as the input error signal.

In the DSP (2), a difference between the input error signal e2 and the aforesaid convolution summation output $\Sigma_1$ is found, and the obtained results are input as the error information e11, e12, and e13 to the DSP's (11), (12), and (13), respectively. In the DSP's (11), (12), and (13), the respective coefficient updatings of the FIR filters 11, 12, and 13 are carried out by the coefficient updating units ("UPDATA" in the diagram, the same also for the following) so that the input error information e11, e12, and e13 become the minimum.

Where the input error information e11, e12, and e13 become the minimum, it can be considered that the respective coefficients of the FIR filters 11, 12, and 13 in the DSP's (11), (12), and (13) have been found. Where such a connection configuration is established, the FIR filters 11, 12, and 13 simulate the propagation system C, and therefore become functionally equivalent to the wraparound preventing filter 3. Namely, the coefficients found become equivalent to the coefficients of the wraparound preventing filter 3. Therefore, the found filter coefficients of the FIR filters 11, 12, and 13 are transferred to the DSP (3) for the wraparound preventing filter 3. The DSP (3) receives the coefficients from the FIR filters 11, 12, and 13, and then uses the same as the coefficients of the wraparound preventing filter 3.

Figure 14:
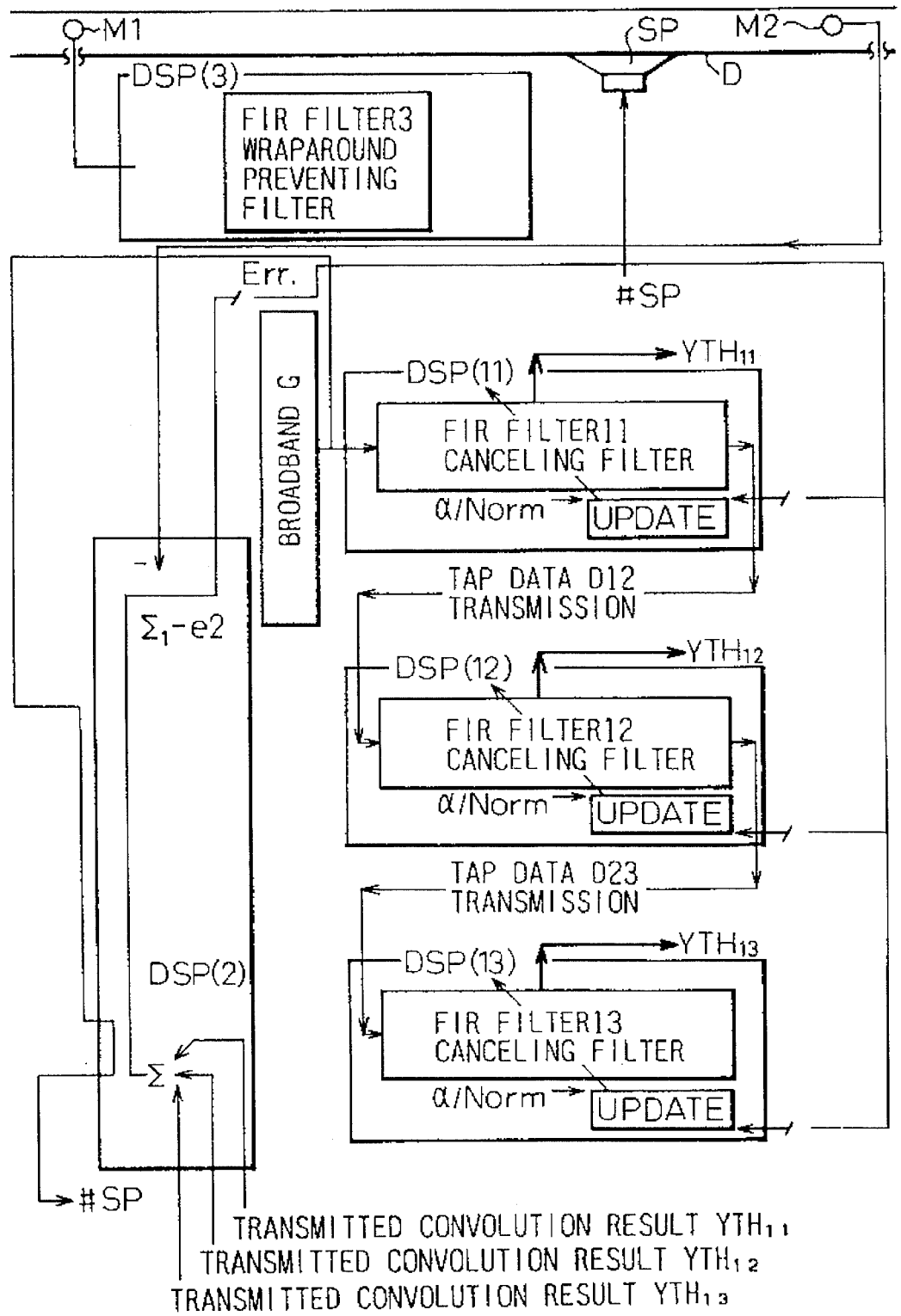
FIG. 14 is a view explaining the operation in the fifth embodiment of the signal suppressing apparatus of the present invention.

Next, a method of performing the advance learning of the coefficients for the FIR filter 2 in the DSP (2) using the coefficient updating unit (UPDATE) of the DSP's (11), (12), and (13) will be explained. FIG. 14 shows a detailed state of this case.

A broadband noise signal is input from the aforementioned generator G to the secondary source (SP). At the same time, this broadband noise signal is input also to the DSP (11). The data of this broadband noise signal is sequentially input also to the FIR filters 12 and 13 by the tap data shift of the FIR filter 11. Also, the individual convolution results $YTH_{11}$, $YTH_{12}$, and $YTH_{13}$ of the FIR filters 11, 12, and 13 are tabulated in the DSP (2) using the convolution result transmission line (see FIG. 16), the summation of them is performed, and the convolution summation output $\Sigma_1$ is obtained.

On the other hand, the broadband noise released from the secondary source is propagated through the propagation system B and input to the error detecting (residual sound detecting) microphone M2. The output of this error detecting microphone M2 is input as the input error signal e2 into the DSP (2).

In the DSP (2), the difference between the input error signal e2 and the aforesaid convolution summation output $\Sigma_1$ is found, and the result is input as the input error information e11, e12, and e13 to the DSP's (11), (12), and (13). In the DSP's (11), (12), and (13), the respective coefficient updatings of the FIR filters 11, 12 and 13 are carried out at the respective coefficient updating units so that the input error information e11, e12, and e13 become the minimum.

Where the input error information e11, e12, and e13 become the minimum, it can be considered that the coefficients of the FIR filters 11, 12, and 13 of the DSP's (11), (12), and (13) have been found. When such a connection configuration is adopted, this means that the FIR filters 11, 12, and 13 simulated the propagation system B, and therefore become functionally equivalent to the FIR filter 2. Namely, the coefficients obtained here become equivalent to the coefficients of the FIR filter 2. Therefore, the coefficients of the FIR filters 11, 12, and 13 are transferred to the DSP (2). In the DSP (2), the coefficients from the FIR filters 11, 12, and 13 are received and then they are used as the coefficients of the FIR filter 2.

In above description, in the present fifth embodiment, the coefficient updating units were respectively employed in the DSP's (11), (12), and (13) constructing the canceling filters 11, 12, and 13, and these coefficient updating units were commonly used also as the coefficient updating units of the FIR filter 2 and the wraparound preventing filter 3, but the present invention is not restricted to this. It is also possible to provide, in place of the coefficient updating units of the filters in the DSP's (11), (12), and (13), the same on the DSP (2) side or the DSP (3) side. Namely, it is also possible to employ the coefficient updating unit in the FIR filter 2 in the DSP (2), and commonly use the coefficient updating unit of this DSP (2) by the canceling filters 11, 12, and 13 of the DSP's (11), (12), and (13) and the wraparound preventing filter 3 in the DSP (3). Alternatively, it is also possible to employ the coefficient updating unit in the wraparound preventing filter 3 of the DSP (3) and commonly use this coefficient updating unit by the FIR filter 2 in the DSP (2) and the canceling filters 11, 12, and 13 of the DSP's (11), (12), and (13).

Where the coefficient updating units are provided on the DSP (11), (12), and (13) side as mentioned above and these updating units are commonly used by the FIR filters 2 and 3, it is of course acceptable even if the DSP (2) and DSP (3) are split into a plurality of filters as already mentioned. However, even if the DSP's (2) and (3) are respectively composed by one chip, the processing speed will not become slower with respect to the DSP's (11), (12), and (13) due to nonexistence of the coefficient updating processing, and accordingly these FIR filters 2 and 3 can be composed by one DSP each. By this, a reduction of the size of the hardware can be achieved. Similarly, where the coefficient updating units are provided in the DSP's (2) and (3), it is also possible to constitute the DSP's (11), (12), and (13) without a split, whereby the reduction of the size of the hardware scale can be achieved. Note that, where a structure of splitting the filter into a plurality of filters is adopted, the number of the split filters is optional.

Figure 16:
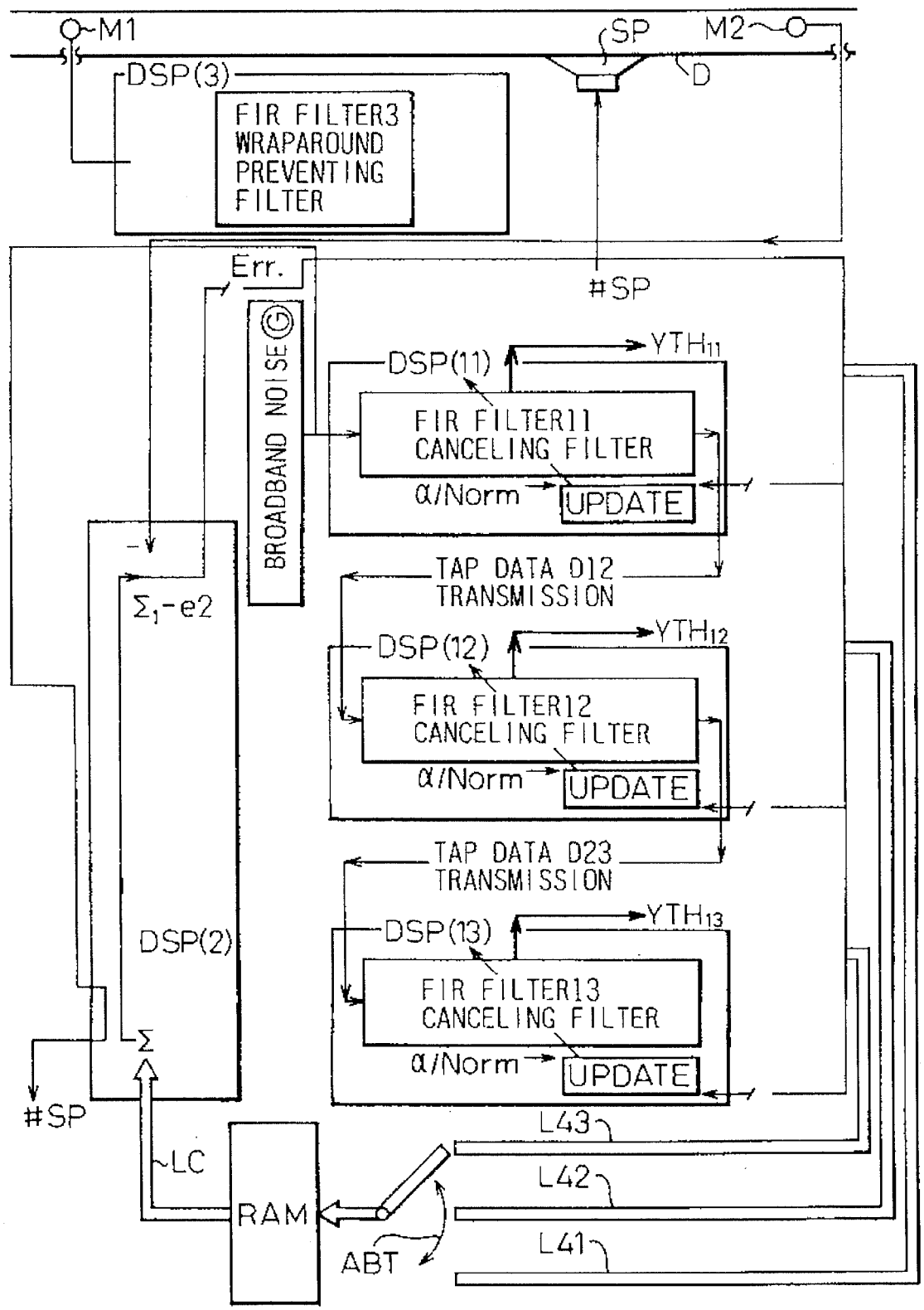
FIG. 16 is a view concretely showing convolution result transmission lines in the fifth embodiment.

FIG. 16 is a view concretely representing the aforementioned convolution result transmission lines, through which transmission lines the convolution results $YTH_{11}$, $YTH_{12}$ and $YTH_{13}$ are tabulated at the DSP (2).

In the figure, references L41, L42, and L43 are the above-mentioned convolution result transmission lines, each of which comprises for example a 16 bit bus.

These buses (L41, L42, and L43) are sequentially connected to a random access memory RAM via an arbiter ABT. This RAM is preferably a dual-port RAM and is connected at the other end to the DSP (2) via the common transmission line Lc.

Figure 17:
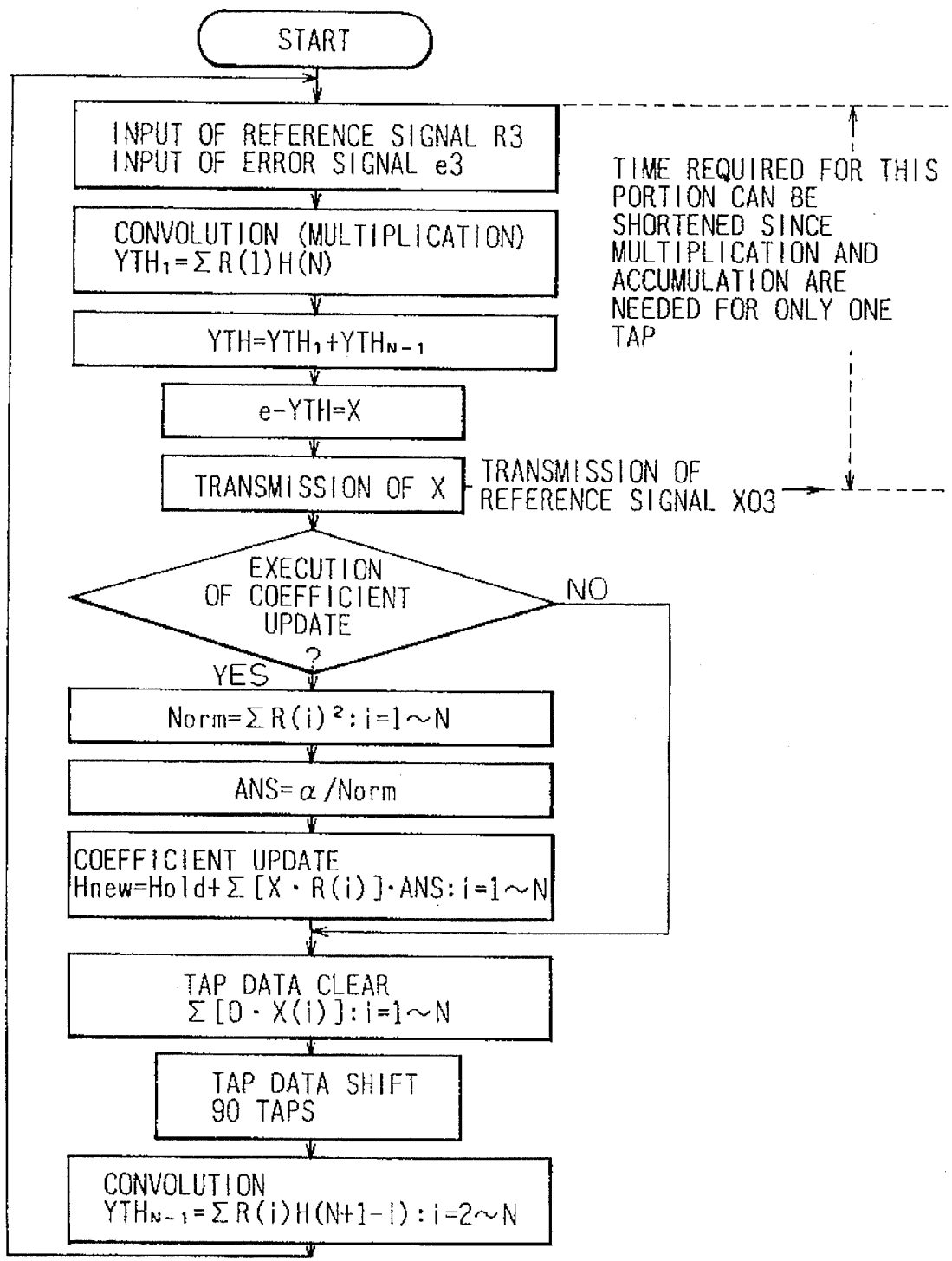
FIG. 17 is a view showing the flow of processing in a DSP in a sixth embodiment of the signal suppressing apparatus of the present invention.

FIG. 17 shows a further sixth embodiment of the present invention. For example, in the processing system of the above-described fourth embodiment, the wraparound preventing filter 3 (FIR filter) of the DSP (3) usually finds the wraparound sound after the input data (reference signal input R3 in FIGS. 10A and 13) is input to the FIR filter thereof and by performing the convolution calculation using all the tap data thereof. For this reason, the convolution operation result cannot be subtracted from the reference signal obtained at the microphone M1 after the propagation through the propagation system C until the convolution operation result (simulated wrapped around sound) is obtained, and therefore the processing time required for this convolution operation becomes a factor of the time delay. This sometimes becomes a factor limiting the performance of the active noise control system. This is particularly conspicuous in the case of the structure shown in the fourth embodiment performing the control of non-periodic random noise.

Therefore, the convolution output in the DSP (3) of the fifth embodiment (FIG. 13) is produced in advance for the convolution operations possible at a point of time before the reference signal R3 is input to the FIR filter 3 in the DSP (3). Only convolution which cannot be carried out at times other than that time is carried out after the reference signal R3 is input to the FIR filter 3 in the DSP (3). The results of former and latter are added to each other, whereby a result equivalent to the convolution output obtained using all the tap data is substantially obtained after the input of the reference signal R3, thereby shortening the processing time.

The sixth embodiment performing such processing will be explained by the flow of processing of FIG. 17. This FIG. 17 shows a situation performing the coefficient updating by the coefficient updating algorithm by the NLMS method in the DSP (3) of the wraparound preventing FIR filter 3 (the aforementioned fifth embodiment (FIG. 13) can be referred to). It is also possible to execute the software from the reference signal R3 to the reference signal X03 (FIG. 10A) among the processings of the fifth embodiment by the processing of the method of this sixth embodiment.

<1> As the input signal of the FIR filter 3, a signal R(i) of the reference signal R3 is first input to the DSP (3) and becomes R(1) since i=1.

<2> The convolution is carried out only for the product of the R(1) and one coefficient data H(N) (that is, the convolution operation is carried out only for the initial tap), and the result thereof is defined as $YTH_1$.

<3> For the tap coefficient of the FIR filter excluding the aforesaid R(1) and H(N), the convolution is executed in advance before the signal R(1) of the reference signal R3 is input, the convolution result $YTH_{N-1}$ thereof is held, and that held convolution result $YTH_{N-1}$ and the $YTH_1$ found in the above-described processing <2> are added. The result thereof is defined as the convolution result YTH of the FIR filter 3.

When the processing is performed in the above way, the software processing from the input of the reference signal R3 to the transmission of the reference signal X03 is ended not by a usual convolution, but by operations of a single multiplication, a single addition, and a single subtraction for performing:

$$YTH_1 = R(1)H(N)$$

$$YTH = YTH_1 + YTH_{N-1}$$

$$e - YTH = X$$

Figure 18:
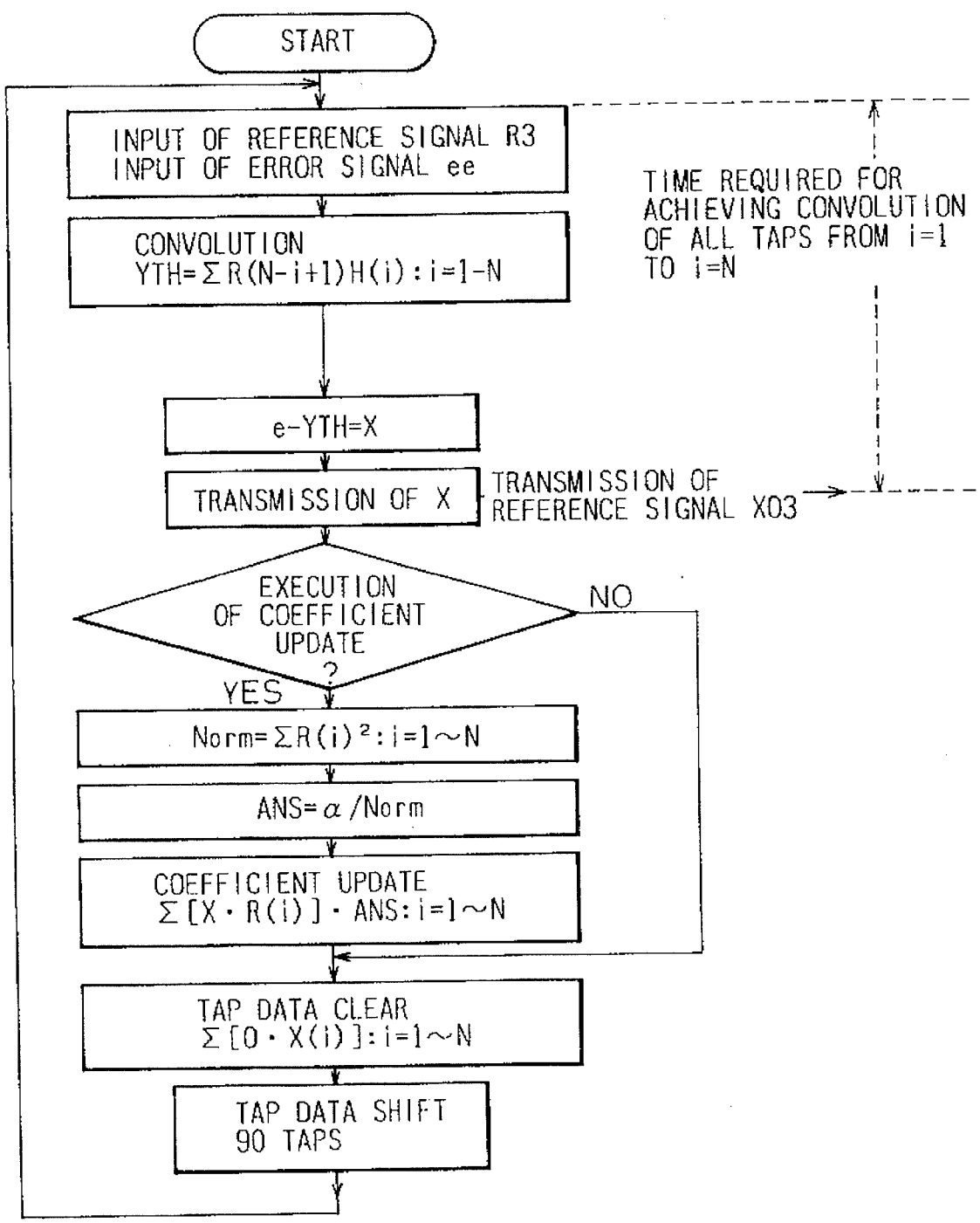
FIG. 18 is a view showing a flow of processing before improvement for explaining the effect of the sixth embodiment.

For comparing the effect of reduction of the amount of operation with the situation of the coefficient updating before this improvement, the flow of coefficient updating before the improvement is shown in FIG. 18. As shown in FIG. 18, the software processing from the input of the reference signal R3 to the transmission of the reference signal R03 performs the usual operation for N-tap convolution:

$$YTH = \Sigma R(N-i+1)H(i)$$

where, i=1 to N
and therefore a very long time is taken. Also, carrying out the processing using a plurality of DSP's becomes inconvenient for dispersion of processing. Particularly, the convolution of from i=1 to i=N is long processing.

Note that, in the sixth embodiment of the above FIG. 17, an example of ending the operation from the input of the reference signal R3 to the transmission of the reference signal X03 by a single multiplication, a single addition, and a single subtraction was shown, but this shows an example where the processing can be minimized and the present invention is not restricted to only this. For example, it is also possible even if there is adopted a method wherein, during a time from the input of the reference signal R3 to the transmission of the reference signal X03, the convolution of the FIR filter is carried out with respect to a half tap of the FIR filter including the R(1) and H(N) (N/2 tap), while the convolution of the FIR filter is carried out in advance for a half tap of the remaining FIR filters (N/2 tap), and held, and the two are added to each other, whereby the convolution result YTH for all taps of the FIR filter is obtained.

Also, in the sixth embodiment, the explanation was made using a convolution operation carried out for the wraparound preventing filter 3 in the DSP (3) as an example, but the application of the present invention to end the convolution operation in advance is not particularly restricted to only the filter for preventing wraparound. It may also be effectively applied to a system performing a convolution operation where the result of the convolution operation becomes necessary immediately after the input signal of the FIR filter is input.

Figure 19:
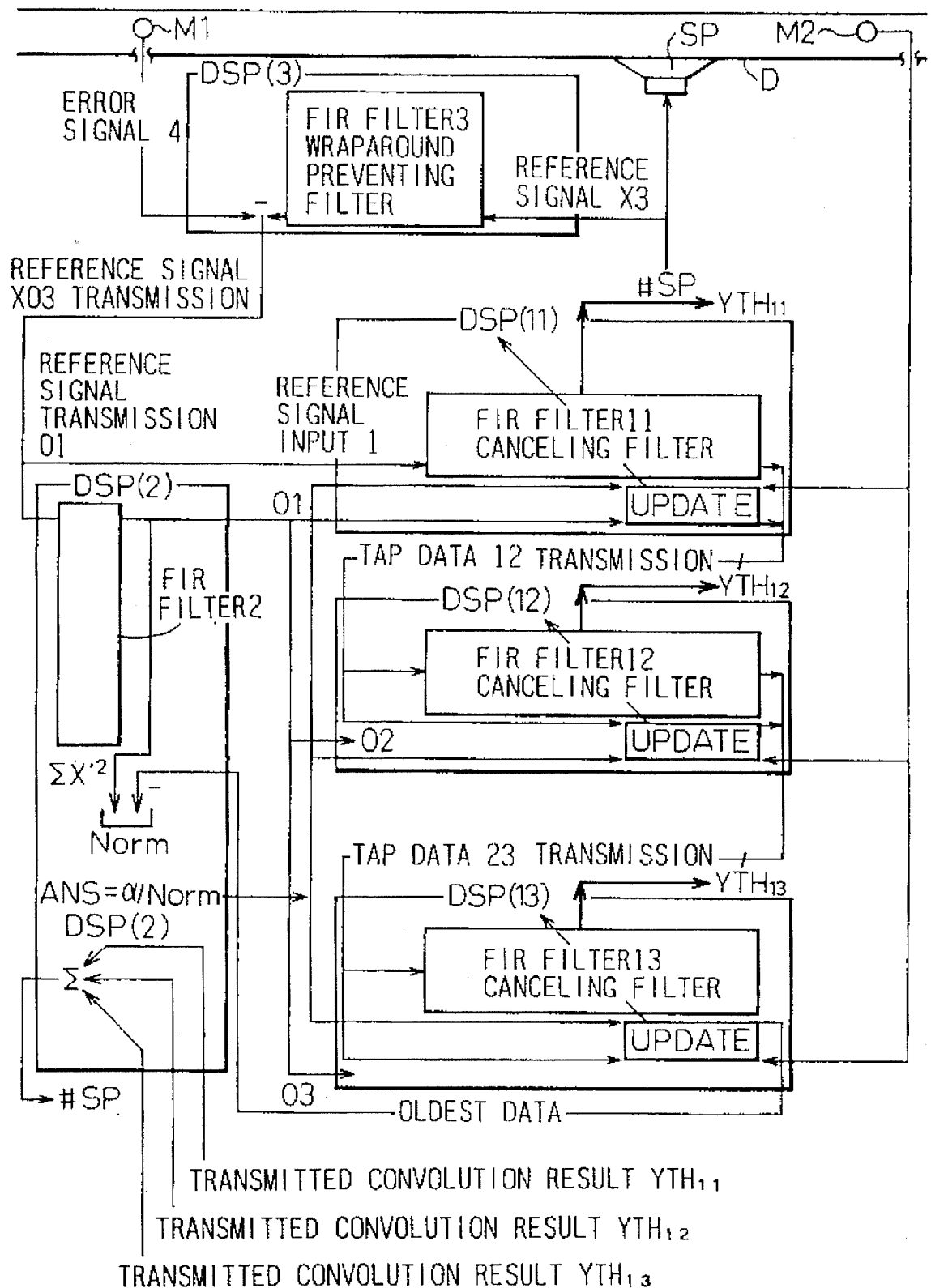
FIG. 19 is a view showing a seventh embodiment of the signal suppressing apparatus of the present invention.

FIG. 19 shows a further seventh embodiment of the present invention. In the processing system of the above-described fifth embodiment of FIG. 13, the information X' which is output from the FIR filter 2 in the DSP (2) is transmitted from the DSP (2) to the DSP's (11), (12), and (13). This information X' is used for the coefficient updating in the coefficient updating units in the DSP's (11), (12), and (13).

In this case, there are the following problems. In each of the DSP's (11), (12), and (13), for the coefficient updating, the squared cumulative value Norm of the information X', i.e., $$Norm = |\Sigma X'^2(i)|$$

is found by an coefficient updating algorithm based on the aforementioned NLMS method. This means that the cumulative value in this case is the accumulation for exactly the same number of taps as the total number of the total taps of the DSP's (11), (12), and (13).

That is, the taps of the canceling filter are split into three at the DSP's (11), (12), and (13), but no matter what number the taps are split into, in the respective DSP's (11), (12), and (13), it is necessary to find the squared cumulative value Norm of the information X' for exactly the same number of taps as the total number of taps of the canceling filters 11, 12, and 13 at the time of the coefficient updating. For this reason, in the structure of the aforementioned fifth embodiment, the squared cumulative value Norm of the same number of taps as the total number of taps of the canceling filters 11, 12, and 13 is found in an overlapping manner in each of the DSP's (11), (12), and (13).

In the concrete method of finding the squared cumulative value Norm in the structure of the fifth embodiment, whenever the information X' is input to the DSP's (11), (12), and (13), that input data is squared and accumulated at the coefficient updating unit. After this squared cumulative value is tabulated for exactly the same number of taps as the total number of taps of the DSP's (11), (12), and (13), the old squared value which remains relative to the input of the information X' is discarded. However, all squared cumulative values and the shift of square values are held in an overlapping manner by the DSP's 11, 12, and 13, so the efficiency is bad, and accordingly there is a problem such that the processing load of the respective DSP's (11), (12), and (13) becomes heavier by that overlapping amount.

Therefore, in the seventh embodiment, the constitution is made so that a squared cumulative value Norm is found in the DSP (2), and the information Norm is transmitted all at once to the DSP's (11), (12), and (13). A detailed explanation will be given relative to FIG. 19. The signal output as the information X' from the FIR filter 2 in the DSP (2) is squared and accumulated. So as to find the squared cumulative value Norm, it is necessary to subtract from the cumulative value the squared value of the final tap data after the elapse of a time corresponding to the tap data of the FIR filters constructed in the DSP's (11), (12), and (13) whenever the information X' is produced. Therefore, the final data (oldest data) from the coefficient updating unit in the canceling filter 13 is returned from the DSP (13) to the DSP (2). As a result, in contrast with the finding of the squared cumulative value Norm in an overlapping manner by each of the DSP's (11), (12) and (13), it is sufficient if just the DSP (2) finds the squared cumulative value Norm, which contributes to the reduction of the software processing.

Further, it is also possible to determine the learning coefficient ($\alpha$ in FIG. 19) in the DSP (2), find also:

$$ANS=\alpha/Norm$$

in the DSP (2), and to transmit the result thereof (ANS in FIG. 19) from the DSP (2) to the DSP's (11), (12), and (13) all at once. As a result, it is sufficient so far as the division requiring the largest processing cycle in the general DSP is executed only by the DSP (2), which also contributes to the reduction of the software processing.

Note that, in the seventh embodiment, the Norm operation unit was provided in the DSP (2), and the filter taps were split in the DSP's (11), (12), and (13), but the disposition of the Norm operation unit is not particularly restricted to the DSP (2). It can be disposed in any DSP. For example, it is also possible to provide the Norm operation unit in the parts of the DSP split for example the DSP's (21) and (22) of the third embodiment.

Also, in the present embodiment, as mentioned above, the structure is based on a filtered—X algorithm and the square accumulation of the output of the FIR filter 2 is carried out for the Norm operation, but for a case of the first embodiment where coefficient updating according to the NLMS algorithm is sufficient, it becomes square accumulation of the output of the microphone M1 of FIG. 2 and the reference signal X1 in FIG. 3A. This becomes the squared cumulative value of the tap data per se of the FIR filters 11, 12, and 13 of FIGS. 3A to 3C, so the present seventh embodiment can be applied without problem.

Figure 20:
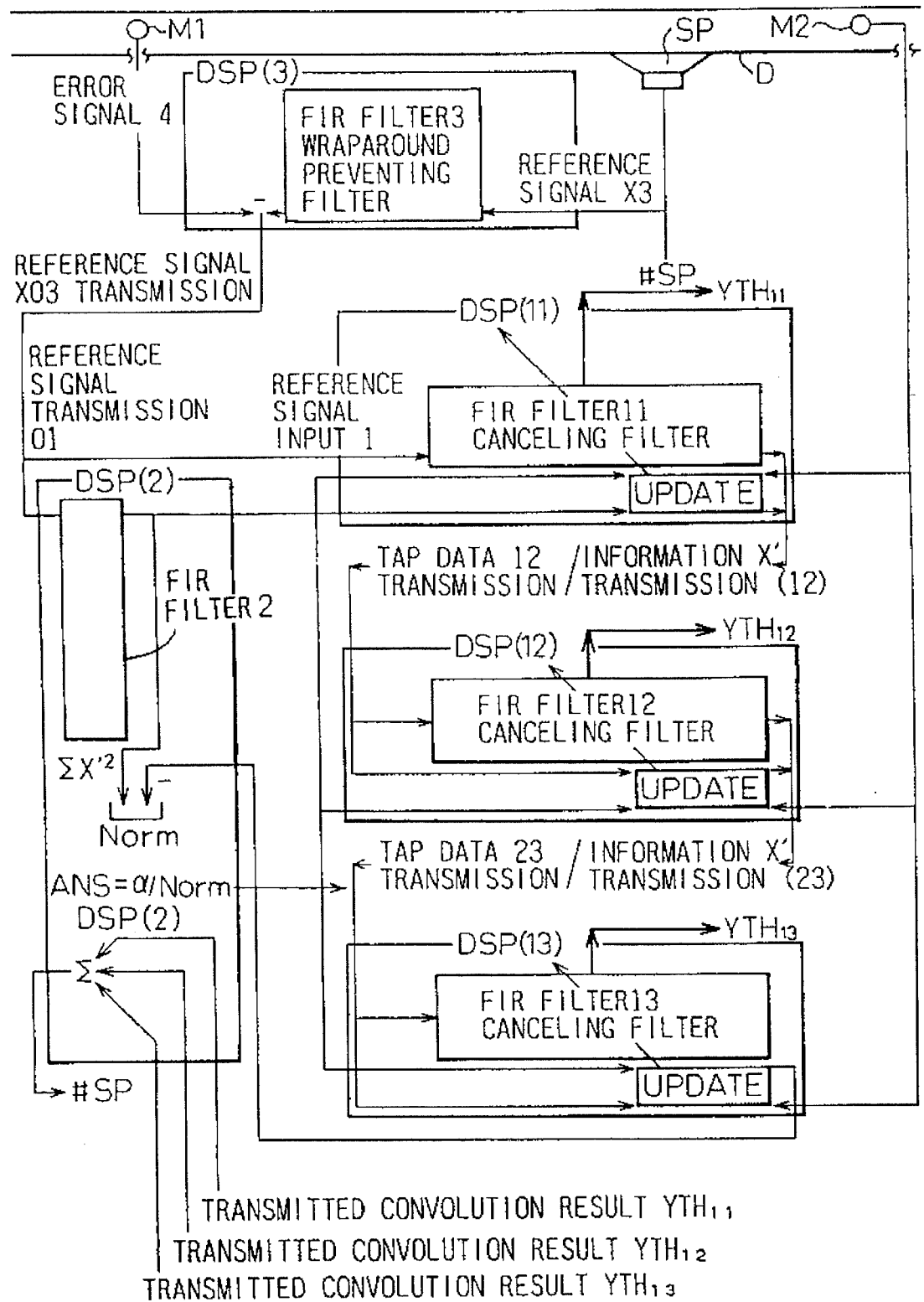
FIG. 20 is a view showing an eighth embodiment of the signal suppressing apparatus of the present invention.

For the method of performing the aforementioned Norm operation in FIG. 19 inside the DSP (2), an eighth embodiment of the present invention will be explained using FIG. 20.

In the processing system described in the above-described fifth embodiment (FIG. 13), the information X' is transmitted simultaneously from the DSP (2) to the DSP's (11), (12), and (13). In the respective coefficient updating units in the DSP's (11), (12), and (13), the information X' is used at the time of updating of the coefficients. In this case, it is necessary to shift also the information X' and hold the same in the same way as the tap data of the FIR filter. For this reason, the following problem occurs.

The tap part of the FIR filter is split into three in the fifth embodiment by the DSP's (11), (12), and (13). Since the DSP (11) is at the initial stage, the shift of the information X' is not so serious a problem. However, it is necessary to excessively perform the shift of the same number as that for the canceling filter 11 in the DSP (11) and the canceling filter 12 in the DSP (12) since the DSP (13) exists at the final stage. For this reason, there is an inconvenience that the processing load of the DSP (13) becomes heavy.

Therefore, the information X' is sequentially transferred along a path similar to that for the tap data of the canceling filters 11, 12, and 13 through DSP (11)→DSP (12)→DSP (13). By this, it is possible to make the number of shifts in the DSP's (11), (12), and (13) the same, and therefore the basic parts of also the software in the DSP's (11), (12), and (13) can be made common. In this case, also the coefficient transfer can be performed by the same signal line as the transmission line of the tap data D12 for the DSP (11) to the DSP (12) and the transmission line of the tap data D23 from the DSP (12) to the DSP (13).

Figure 21:
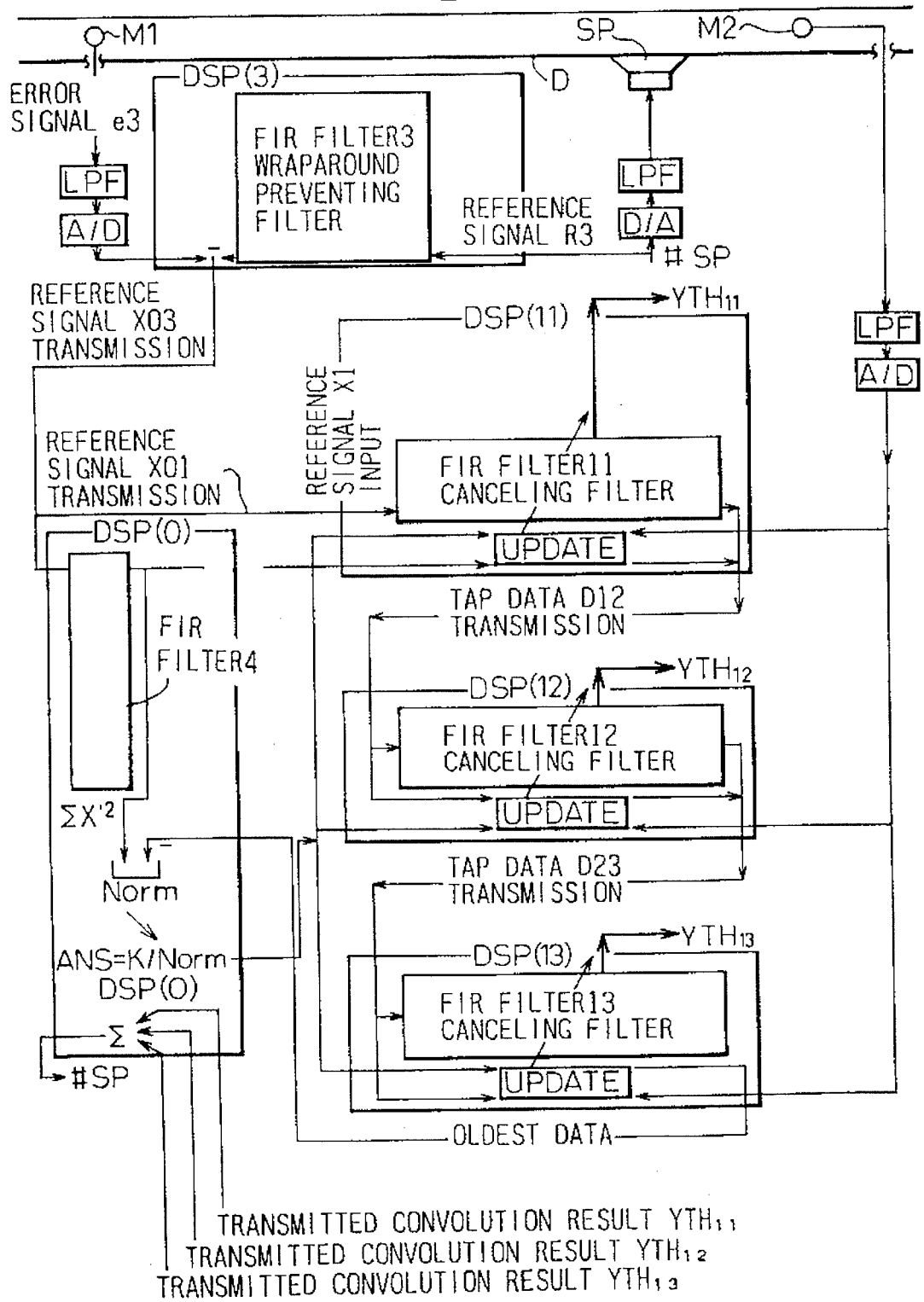
FIG. 21 is a view showing a ninth embodiment of the signal suppressing apparatus of the present invention.

FIG. 21 shows a ninth embodiment of the present invention.

In FIG. 21, (i) is a case where the detection signal (reference signal) of the noise detecting microphone M1 is subjected to A/D conversion; (ii) a case where the signal for suppressing the undesired signal is produced and that suppression signal is subjected to D/A conversion (smoothing filter); and (iii) a case where the error signal for detecting the error after the suppression is subjected to the A/D conversion. In all these cases, it is necessary to pass the same through a low pass filter (LPF) serving as the anti-aliasing filter. The low pass filter which has been generally used for this purpose has a gain characteristic as flat as possible, i.e., a Butterworth characteristic in the pass band. For example in the case of an n-th order low pass filter of the Butterworth characteristic, if the cut-off frequency is fc, the signal is delayed by a time which can be represented by:

$$(\pi/4)\times(1/fc)\times n$$

Not restricted to the Butterworth characteristic, the delay time of the low pass filter becomes longer proportionally to the number of stages, and therefore preferably the number of stages is as small as possible. However, when the number of stages is reduced, there is a defect that the removal of the folding component becomes incomplete.

Therefore, it becomes important to adopt a low pass filter having as small a number of stages as possible and with which a desired cut-off attenuation amount can be obtained.

In general, the Butterworth characteristic is stable since the position of the pole is located on the left half plane on the unit circle, but there is a defect that since the pole position thereof is located on the unit circle, the factor Q when acting as a low pass filter is low.

In the Chebyshev characteristic, there are defects of a difficulty of ensuring stability in the respective stages, a generation of delay distortion, etc., but the pole position exists on an ellipse with an imaginary axis longer in comparison with a real axis, and consequently this increases the Q as the low pass filter. For example, where the number of orders n=5, the Chebyshev characteristic can obtain a cut-off attenuation amount larger by 24 dB than the Butterworth characteristic.

Next, in the simultaneous Chebyshev characteristic, the Q of the low pass filter is further higher than the Chebyshev characteristic. Also, it exhibits a ripple characteristic equal in the pass band and the rejection band. Among them, particularly the ripple in the pass band is a problem, but in the case of the present embodiment, if the FIR filter coefficient in the DSP is made adaptive, the ripple thereof is absorbed, and there no longer exists a problem.

For the cut-off attenuation amount, the amount which can be ensured when the number of orders n=17 in the Butterworth characteristic can be ensured when n=8 in the Chebyshev characteristic and n=5 in the simultaneous Chebyshev characteristic, respectively. Accordingly, as shown in FIG. 21, if a low pass filter having a simultaneous Chebyshev characteristic is used, when comparing the same with the usual Butterworth characteristic, Bessel characteristic, and Chebyshev characteristic, the desired attenuation amount can be obtained with a lower order. Accordingly, the group delay of the low pass filter part can be reduced. Note, in FIG. 21, where the error signal from the error detecting microphone M2 for detecting the error after the suppression is subjected to the A/D conversion, the low pass filter (LPF) is information of modification of the coefficient, and therefore it is not necessary to consider the group delay so much. Accordingly, there is not so much of a necessity to adopt the low pass filter of the simultaneous Chebyshev characteristic.

Next, a case where a general oversampling technique is adopted will be considered. As shown in FIG. 21, in a case where low pass filtering is performed by a low pass filter (LPF) before A/D conversion and a digital filter in various digital states after A/D conversion and a case where the low pass filtering is performed by a digital filter in a digital state before the D/A conversion, if the digital filter is realized by a filter having a simultaneous Chebyshev characteristic, the group delay in the digital filtering part can be reduced for the above-described reason, which contributes to the increase of speed of the processing system.

As explained above, a) (FIG. 1 to FIG. 12) it becomes possible to realize the respective filters by discrete DSP's, respectively. By operating these DSP's simultaneously in parallel, an increase of the processing speed can be achieved, b) by constructing the filter as an adaptive filter, the propagation system to be simulated can be more accurately approximated, c) (FIGS. 13 to 16) the coefficient updating unit of the filter is mounted in any of the DSP's, and the coefficient updating unit is commonly used also as the coefficient updating unit of the remaining other filters, whereby a reduction of the DSP load can be achieved.

d) (FIGS. 17 and 18) concerning the convolution operation of the filters constructed at the respective DSP's, the convolution operations for the taps for which the input data of the filter is unnecessary are ended before the input data of the filter is input, the convolution operations requiring the input data of the filter or only multiplication are executed immediately after the input data of the filter is obtained, and these are added with the results of the convolution operations calculated in advance, whereby the time until the production of the results of the convolution operations can be shortened, e) (FIG. 19) the calculation for finding the squared cumulative value is carried out all at once with respect to the split filters, whereby the scale of the software and hardware can be reduced, f) (FIG. 20) the load of the shift processing of the split filters at latter stage can be reduced.

g) (FIG. 21) the anti-aliasing filter, etc. is composed by a filter of the simultaneous Chebyshev characteristic, whereby an increase of processing speed can be achieved.

By the above, consequently it becomes possible to perform the processing of a signal suppressing apparatus at a high speed. For example, the processings of the DSP's can be simultaneously executed. As a result, the realization of the phase characteristic of the transfer function needed by the control system becomes possible.

What is claimed is:

1. A signal suppressing apparatus comprising:

a first filter which electrically simulates a propagation system A through which physical phenomena to be suppressed are passed, the first filter being split into a plurality of individual filters, a signal correlated to a signal input to the propagation system A being input to said individual filters of this first filter; outputs being individually calculated in the individual filters, results of said individual calculations being tabulated and output, and the output of this first filter influencing the signal input to and which passed through the propagation system A, to make the passed signal approximate an intended value of said phenomena after suppression, whereby a phenomena value, the same as the value obtained where a similar calculation is made without splitting the first filter, is obtained; and a second filter which electrically simulates a propagation system B, said system B connecting at an output thereto to system A, said output of said first filter passing through said propagation system B to system A so as to exert an influence upon said signal input and passing through the propagation system A, the signal input to said first filter also being input to the second filter, an output of said second filter being input to said first filter and used for correction of coefficients of the individual filters of the first filter.

2. A signal suppressing apparatus as set forth in claim 1, wherein said second filter electrically simulating the propagation system B includes a plurality of individual filters; outputs being individually calculated at the individual filters; individual calculation results being tabulated, whereby a value identical to the value obtained when a calculation is made without said plurality of filters of the second filter, is obtained.

3. A signal suppressing apparatus as set forth in claim 1, wherein, where the tabulated value of the results of calculation of a plurality of filters obtained by splitting of the first filter includes a component of a propagation system C of a path inversely returning to the input side of said first filter, a third filter electrically simulating the propagation system C is provided and the influence of propagation of the tabulated value of a plurality of filters through the propagation system C upon the input of said second filter is reduced using the output of said third filter, wherein said first filter is connected between both ends of said propagation system A, said second filter is connected at the output side of said first filter, and said third filter is connected in parallel with said first filter.

4. A signal suppressing apparatus as set forth in claim 3, wherein said third filter is split into a plurality of filters;

outputs are individually calculated at the individual split filters; and the individual calculation results are tabulated, whereby a value the same as the value obtained when a calculation is made without said plurality of filters of the third filter, is obtained.

5. A signal suppressing apparatus as set forth in claim 1, wherein at least one filter among the first and second filters includes at least one adaptive filter containing a coefficient updating unit by which the coefficient of that at least one filter is corrected using information on error from an intended value so to approximate the propagation system to be simulated by that filter.

6. A signal suppressing apparatus as set forth in claim 3, wherein at least one filter among the first, second, and third filters includes at least one adaptive filter containing a coefficient updating unit by which the coefficient of that at least one filter is corrected using information on error from an intended value so to approximate the propagation system to be simulated by that filter.

7. A signal suppressing apparatus as set forth in claim 4, wherein at least one filter among the first, second, and third filters includes at least one adaptive filter containing a coefficient updating unit by which the coefficient of that at least one filter is corrected using information on error from an intended value so to approximate the propagation system to be simulated by that filter.

8. A signal suppressing apparatus as set forth in claim 5, wherein said coefficient updating unit of one of said filters is commonly used as the coefficient updating unit of the other of said filters.

9. A signal suppressing apparatus as set forth in claim 6, wherein said coefficient updating unit of one of said filters is commonly used as the coefficient updating unit of the other of said filters.

10. A signal suppressing apparatus as set forth in claim 7, wherein said coefficient updating unit of one of said filters is commonly used as the coefficient updating unit of the other of said filters.

11. A signal suppressing apparatus as set forth in 1, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and
a means for tabulating the above-described stored operation results and newly obtained operation results to obtain the convolution operation result of the filter.

12. A signal suppressing apparatus as set forth in claim 3, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and
a means for tabulating the above-described stored operation results and newly obtained operation results to obtain the convolution operation result of the filter.

13. A signal suppressing apparatus as set forth in claim 4, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and
a means for tabulating the above-described stored operation results and newly obtained operation results to obtain the convolution operation result of the filter.

14. A signal suppressing apparatus as set forth in claim 5, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and
a means for tabulating the above-described stored operation results and newly obtained operation results to obtain the convolution operation result of the filter.

15. A signal suppressing apparatus as set forth in claim 6, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and
a means for tabulating the above-described stored operation results and newly obtained operation results to obtain the convolution operation result of the filter.

16. A signal suppressing apparatus as set forth in claim 7, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and
a means for tabulating the above-described stored operation results and newly obtained operation results to obtain the convolution operation result of the filter.

17. A signal suppressing apparatus as set forth in claim 8, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and
a means for tabulating the above-described stored operation results and newly obtained operation results to obtain the convolution operation result of the filter.

18. A signal suppressing apparatus as set forth in claim 9, wherein, where a convolution operation is carried out in each of the above-described filters, provision is made of
a means for preliminarily executing and storing the operation before new data is input to the filter for a part of the convolution operation which can be performed based on the data already set in the filter;
a means for executing a convolution operation after the input of the data for newly input filtering data; and a means for tabulating the above-described stored operation results and newly obtained operation results to obtain the convolution operation result of the filter.

19. A signal suppressing apparatus as set forth in claim 10, wherein, where a convolution operation is carried out in each of the above-described filters, provision is made of a means for preliminarily executing and storing the operation before new data is input to the filter for a part of the convolution operation which can be performed based on the data already set in the filter;

a means for executing a convolution operation after the input of the data for newly input filtering data; and a means for tabulating the above-described stored operation results and newly obtained operation results to obtain the convolution operation result of the filter.

20. A signal suppressing apparatus as set forth in claim 1, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

21. A signal suppressing apparatus as set forth in claim 3, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

22. A signal suppressing apparatus as set forth in claim 4, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

23. A signal suppressing apparatus as set forth in claim 5, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

24. A signal suppressing apparatus as set forth in claim 6, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

25. A signal suppressing apparatus as set forth in claim 7, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

26. A signal suppressing apparatus as set forth in claim 8, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

27. A signal suppressing apparatus as set forth in claim 9, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

28. A signal suppressing apparatus as set forth in claim 10, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

29. A signal suppressing apparatus as set forth in claim 11, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

30. A signal suppressing apparatus as set forth in claim 12, wherein provision is made of a single calculation means for finding a square cumulative value where each of the above-described split filters must find a square cumulative value of the data in all taps of the filter before the split or a value obtained by accumulating the square values of the outputs of the above-described second filter in exactly the same number as the taps before the split of the above-described first filter; and the square cumulative values calculated by this calculation means are individually transferred to each of the split filters.

31. A signal suppressing apparatus as set forth in claim 20, wherein the second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

32. A signal suppressing apparatus as set forth in claim 21, wherein the second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

33. A signal suppressing apparatus as set forth in claim 22, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

34. A signal suppressing apparatus as set forth in claim 23, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

35. A signal suppressing apparatus as set forth in claim 24, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

36. A signal suppressing apparatus as set forth in claim 25, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

37. A signal suppressing apparatus as set forth in claim 26, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

38. A signal suppressing apparatus as set forth in claim 27, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

39. A signal suppressing apparatus as set forth in claim 28, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

40. A signal suppressing apparatus as set forth in claim 29, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

41. A signal suppressing apparatus as set forth in claim 30, wherein said second filter which simulates the above-described propagation system B is provided; the output of the second filter is transmitted to an initial filter obtained by splitting the first filter; the initial filter stores the input data immediately after the transmission data from the second filter is input, further shifts a position of the address, register, or the like storing the input data whenever the input data are sequentially input, and thereby transfers the thus determined oldest input data to the next filter of the split, the oldest input data being determined according to an amount of said shifting, and the next filter executes an operation similar to that of the initial filter, and, where a further next filter exists, transfers the oldest input data to that filter, these operations being repeated.

42. A signal suppressing apparatus as set forth in claim 2, wherein provision is made of a single calculation means for finding a square cumulative value where each of the above-described split filters must find a square cumulative value of the data in all taps of the filter before the split or a value obtained by accumulating the square values of the outputs of the above described second filter in exactly the same number as the taps before the split of the above described first filter; and the square cumulative values calculated by this calculation means are individually transferred to each of the split filters.

43. A signal suppressing apparatus comprising:

a first filter which electrically simulates a propagation system A through which physical phenomena to be suppressed are passed, said first filter including a plurality of individual filters, a signal correlated to a signal input to the propagation system A being input to the individual filters of said first filter; outputs being individually calculated in the individual filters, results of said individual calculations being tabulated and output, said output of said first filter influencing the signal input to and which passed through the propagation system A, to make the passed signal approximate an intended value of said phenomena after suppression, whereby a phenomena value, the same as the value obtained where a similar calculation is made without said plurality of individual filters of the first filter, is obtained;

a filter of a simultaneous Chebyshev characteristic is adopted when using an anti-aliasing filter when detecting a reference signal or an error signal after a suppression of an undesired signal is subjected to an analog-to-digital signal conversion, when using a digital filter receiving as its input a signal after the analog-to-digital signal conversion, when using a smoothing filter used when the suppression signal of the undesired signal is subjected to a digital-to-analog signal conversion, or when using a digital filter receiving as its input the signal before the above-described digital-to-analog signal conversion; and a second filter which electrically simulates a propagation system B, said system B connecting at an output thereto to system A, said output of said first filter passing through said propagation system B to system A so as to exert an influence upon said signal input and passing through the propagation system A, the signal input to said first filter also being input to the second filter, an output of said second filter being input to said first filter and used for correction of coefficients of the individual filters of the first filter.

\* \* \* \* \*